US012392938B2

United States Patent
Davis

(10) Patent No.: US 12,392,938 B2
(45) Date of Patent: Aug. 19, 2025

(54) ENERGETICALLY BONDED ALUMINUM AND OLEOPHOBIC/HYDROPHOBIC COATINGS FOR SUBSTRATE

(71) Applicant: FLIGHTSAFETY INTERNATIONAL INC., Melville, NY (US)

(72) Inventor: Barry Davis, Austin, TX (US)

(73) Assignee: FLIGHTSAFETY INTERNATIONAL INC., Melville, NY (US)

( * ) Notice: Subject to any disclaimer, the term of this patent is extended or adjusted under 35 U.S.C. 154(b) by 907 days.

(21) Appl. No.: 17/371,952

(22) Filed: Jul. 9, 2021

(65) Prior Publication Data

US 2022/0011480 A1 Jan. 13, 2022

Related U.S. Application Data

(60) Provisional application No. 63/049,951, filed on Jul. 9, 2020.

(51) Int. Cl.
*G02B 1/14* (2015.01)
*C23C 14/02* (2006.01)
(Continued)

(52) U.S. Cl.
CPC ............ *G02B 5/085* (2013.01); *C23C 14/025* (2013.01); *C23C 14/10* (2013.01); *C23C 14/14* (2013.01);
(Continued)

(58) Field of Classification Search
CPC . G02B 5/085; G02B 1/14; G02B 1/18; G02B 5/0875; C23C 14/025; C23C 14/10;
(Continued)

(56) References Cited

U.S. PATENT DOCUMENTS 5,177,396 A 1/1993 Gielen et al.
5,215,832 A * 6/1993 Hughes ............... C03C 17/3663
204/192.27
(Continued)

FOREIGN PATENT DOCUMENTS

CN 1429865 7/2003
CN 106062590 10/2016
(Continued)

OTHER PUBLICATIONS

"Military Specification: Mirror, Front Surfaced Aluminized: For Optical Elements," U.S. Department of Defense, No. MIL-M-13508C, Mar. 19, 1973, 8 pages.
(Continued)

*Primary Examiner* — Wyatt A Stoffa
*Assistant Examiner* — John Curtis Sipes
(74) *Attorney, Agent, or Firm* — Sheridan Ross P.C.

(57) ABSTRACT

Optical-quality mirrors having an energetically bonded oleophobic/hydrophobic (O/H) coating are provided, as are methods for making and using such coatings and mirrors. The O/H coating is a thin-film coating that causes water and oils to form beads and become easily removable from the mirror surface, and thus improves the cleanability, contamination resistance, and usable life of the mirror.

20 Claims, 24 Drawing Sheets
(21 of 24 Drawing Sheet(s) Filed in Color)

(51) Int. Cl.
*C23C 14/10* (2006.01)
*C23C 14/14* (2006.01)
*C23C 14/22* (2006.01)
*C23C 14/54* (2006.01)
*G02B 5/08* (2006.01)

(52) U.S. Cl.
CPC ............ *C23C 14/221* (2013.01); *C23C 14/54* (2013.01); *G02B 1/14* (2015.01)

(58) Field of Classification Search
CPC ....... C23C 14/14; C23C 14/221; C23C 14/54; C23C 14/18; C23C 14/24; C23C 14/5833; C23C 28/321; C23C 28/345; C03C 2217/76; C03C 17/3663; C03C 17/38
See application file for complete search history.

(56) References Cited

U.S. PATENT DOCUMENTS

| | | |
|---|---|---|
| 5,424,876 A | 6/1995 | Fujii |
| 6,078,425 A | 6/2000 | Wolfe et al. |
| 6,150,039 A | 11/2000 | Lalezari et al. |
| 6,601,960 B2 | 1/2003 | Richard |
| 7,055,954 B2 | 6/2006 | Marechal |
| 7,162,137 B2 | 1/2007 | Ingman et al. |
| 7,629,053 B2 | 12/2009 | Lacan et al. |
| 8,599,466 B2 | 12/2013 | Agrawal et al. |
| 9,896,549 B2 | 2/2018 | Kessman et al. |
| 10,436,955 B2 | 10/2019 | Dasbach |
| 2002/0061424 A1* | 5/2002 | Nanis ................ G11B 5/73921 428/828 |
| 2007/0141358 A1* | 6/2007 | Jallouli ............ B29D 11/00932 427/165 |
| 2008/0073203 A1 | 3/2008 | Wang et al. |
| 2012/0114969 A1* | 5/2012 | Stremsdoerfer ........ F24S 23/70 428/630 |
| 2014/0133028 A1* | 5/2014 | Kumagai ................ B32B 27/08 359/507 |
| 2014/0272454 A1* | 9/2014 | Zhang ................ C03C 17/3644 428/656 |
| 2015/0198753 A1* | 7/2015 | Aono ....................... G02B 1/18 359/360 |
| 2015/0293275 A1* | 10/2015 | Crifasi ................ G02B 5/0808 428/673 |
| 2016/0170192 A1* | 6/2016 | Yamamoto ............. C08J 7/0423 359/360 |
| 2017/0028924 A1 | 2/2017 | Baur et al. |
| 2017/0315276 A1 | 11/2017 | Dasbach |
| 2021/0074542 A1* | 3/2021 | Atanackovic ....... C23C 14/0026 |

FOREIGN PATENT DOCUMENTS

| | | |
|---|---|---|
| CN | 106796312 | 5/2017 |
| CN | 106918851 | 7/2017 |
| CN | 111123421 | 5/2020 |
| EP | 0573163 | 12/1993 |
| JP | S61-014603 | 1/1986 |
| JP | H05-117842 | 5/1993 |
| JP | H09-101406 | 4/1997 |
| JP | H11-006989 | 1/1999 |
| JP | 2004-078090 | 3/2004 |
| JP | 2005-234188 | 9/2005 |
| JP | 2008-260978 | 10/2008 |
| JP | 2018-185374 | 11/2018 |
| JP | 2019-028422 | 2/2019 |
| JP | 2020-052323 | 4/2020 |
| WO | WO 91/16197 | 10/1991 |
| WO | WO 2019/208426 | 10/2019 |

OTHER PUBLICATIONS

"Military Specification: Coating of Glass Optical Elements (Anti-Reflection)," U.S. Department of Defense, No. MIL-C-675C, Aug. 22, 1980, 18 pages.
Invitation to Pay Additional Fees for International (PCT) Patent Application No. PCT/US2021/041019, dated Sep. 28, 2021, 3 pages.
International Search Report and Written Opinion for International (PCT) Patent Application No. PCT/US2021/41019, dated Dec. 16, 2021, 21 pages.
International Preliminary Report on Patentability for International (PCT) Patent Application No. PT/US2021/041019, dated Jan. 19, 2023 15 pages.
Official Action (with English summary) for Japan Patent Application No. 2023-501169, dated Feb. 27, 2024, 11 pages.
Official Action with English Translation for Japan Patent Application No. 2023-501169, dated Aug. 20, 2024 7 pages.
Supplementary European Search Report for Europe Patent Application No. 21837502, dated Jun. 17, 2024, 9 pages.
Official Action for Canada Patent Application No. 3188379, dated May 24, 2024, 5 pages.
English Translation of Official Action for China Patent Application No. 202180061538.1, dated Feb. 7, 2025 11 pages.

\* cited by examiner

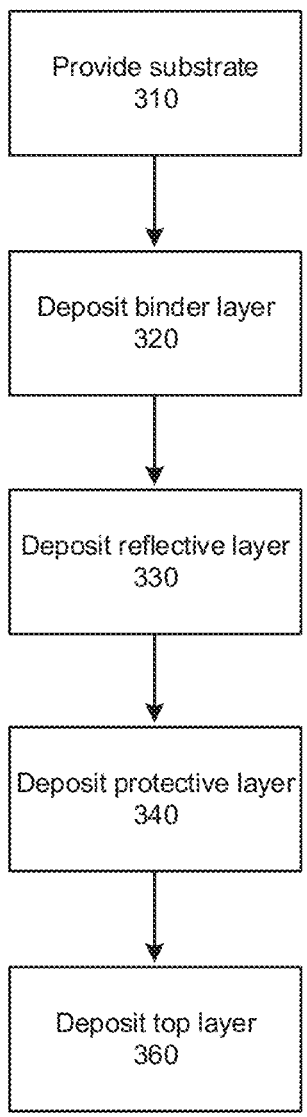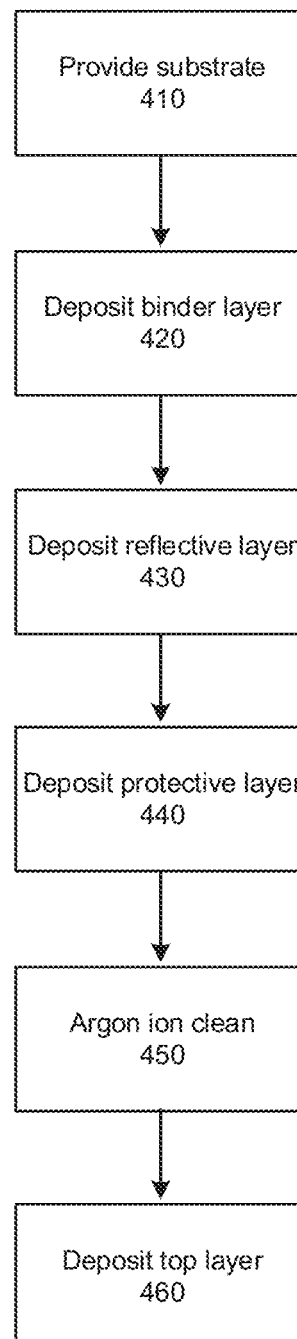
Fig. 3
Fig. 4

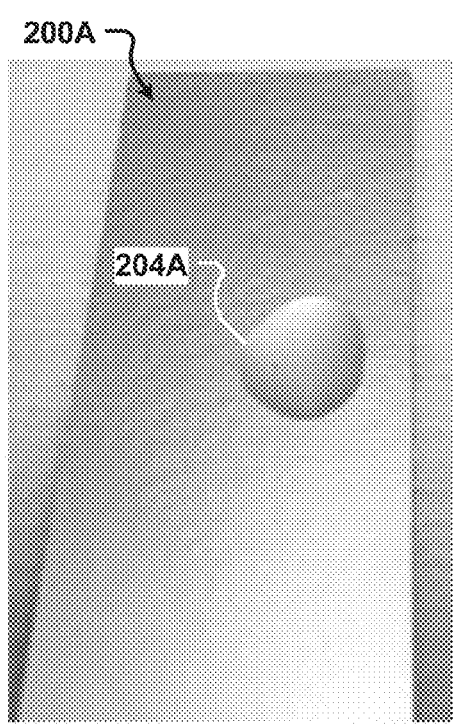
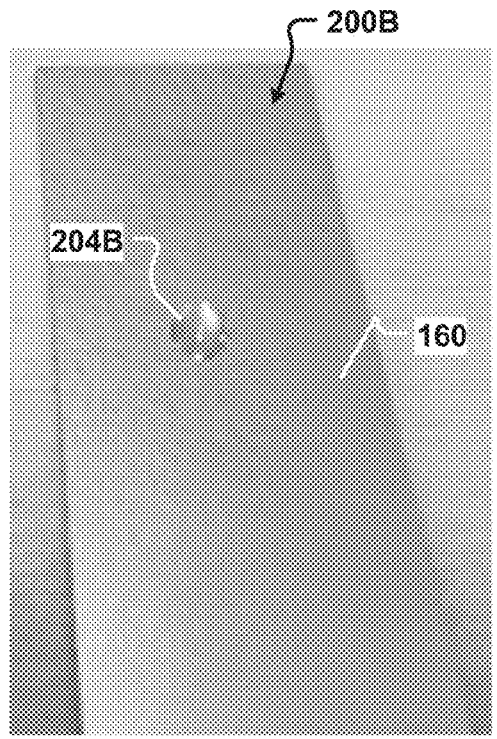
Fig. 6A    Fig. 6B
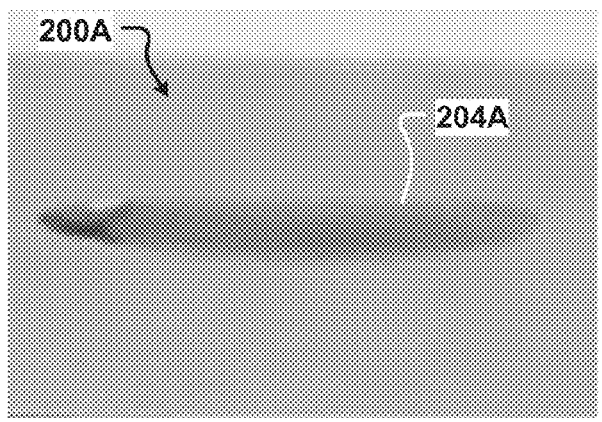
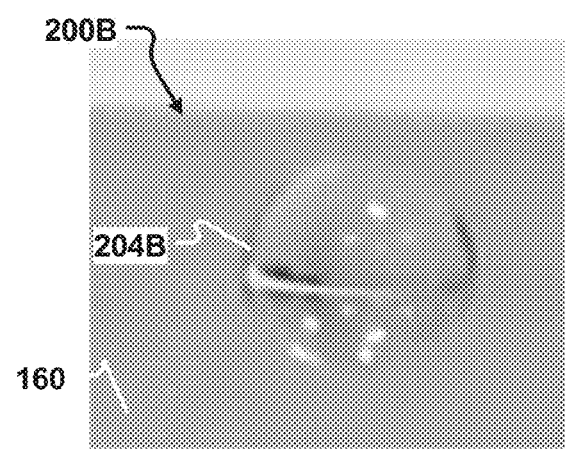
Fig. 7A    Fig. 7B

ENERGETICALLY BONDED ALUMINUM AND OLEOPHOBIC/HYDROPHOBIC COATINGS FOR SUBSTRATE

CROSS-REFERENCE TO RELATED APPLICATION

This application claims the benefit of priority under 35 U.S.C. § 119(e) to U.S. Provisional Patent Application 63/049,951, filed 9 Jul. 2020, the entirety of which is incorporated herein by reference.

FIELD

This disclosure relates generally to coatings for substrates, and specifically to energetically bonded aluminum and oleophobic/hydrophobic (O/H) substrate coatings and methods for forming and using coatings.

BACKGROUND

Coatings including such materials as aluminum, gold, silver, and dielectric materials may be applied to glass articles to make the glass article reflective and create a mirrored surface. To make an optical-quality mirror, which requires high degrees of uniformity and reflectivity, requires greater polishing and precision during creation and deposition of the coating than, for example, a household mirror, which does not require the same high degrees of uniformity or reflectivity. Such optical-quality mirrors are used to reflect light in a wide variety of applications (including but not limited to light beam steering, interferometry, illumination, and optical components of imaging systems) and industries (including but not limited to life sciences, astronomy, meteorology, semiconductors, and solar power).

Oleophobic/hydrophobic (O/H) coatings are thin-film coatings that can be applied to a surface to cause oil and water to form beads and easily fall or otherwise be removed from the surface, rather than spreading out across the surface in a thin, flat layer. O/H coated glasses are commonly used in eyeglasses, cell phone screens, ATM displays, and other small display devices, especially those having high-touch surfaces. The O/H coatings of these items allow the display devices to resist accumulation of environmental contaminants and improve the ease of cleaning the device.

A persistent problem in the manufacture of optical-quality mirrors has been the inability to formulate a durable coating that provides improved resistance to abrasion and physical degradation, cleanability, and resistance to blurring. Previous attempts to provide such coatings have generally been characterized by poor adhesion between the coating layers and the substrate, resulting in a short useful lifetime of the coating before the coating separates from the substrate and/or degrades while remaining on the substrate. In many applications of optical mirrors, the mirror surface may frequently be exposed to scratching or other impacts and/or debris and environmental contaminants, any of which may damage or destroy the uniformity and reflectivity of the mirror surface. It is therefore critical that mirrors used in these applications be scratch- and damage-resistant and easy to clean, especially because mirrors that are difficult to clean may be more susceptible to scratches and damage (i.e. because more pressure or rubbing force is required to clean the mirror). Thus, a coating for an optical mirror that reduces the adhesion of debris and contaminants to the surface may provide a dual benefit, in that it improves not only the cleanability of the mirror but also the mirror's resistance to abrasion and physical degradation.

There is thus a need in the art for coatings for optical mirrors that improve both the mirror's resistance to abrasion and other physical damage and its resistance to contamination and/or ease of cleaning, while maintaining the mirror's optical quality (i.e. uniformity and reflectivity). It is further advantageous for such coatings to have improved coating-substrate adhesion relative to coatings of the prior art. There is a further need for apparatuses and methods for creating such coatings and applying the coatings to a substrate, most commonly a glass substrate.

SUMMARY

In an aspect of the present disclosure, an optical mirror comprises: (1) a base layer; (2) a binder layer, overlying and energetically bonded to the base layer, comprising aluminum metal; (3) a reflective layer, overlying the binder layer, comprising aluminum metal; (4) a protective layer, overlying the reflective layer, comprising silicon dioxide; and (5) a top layer, overlying the protective layer, wherein the top layer is at least one of oleophobic and hydrophobic.

In certain embodiments, the binder layer may be deposited at a first predetermined rate and the reflective layer may be deposited at a second predetermined rate.

In certain embodiments, at least one of the binder layer and the protective layer may be deposited via ion-aided deposition. The ion-aided deposition may, but need not, be argon ion-aided deposition.

In certain embodiments, at least one of the following may be true: (i) a thickness of the binder layer is between about 50 angstroms and about 450 angstroms; (ii) a thickness of the reflective layer is between about 500 angstroms and about 900 angstroms; (iii) a thickness of the protective layer is between about 950 angstroms and about 2350 angstroms; and (iv) a thickness of the top layer is between about 100 angstroms and about 300 angstroms.

In certain embodiments, the optical mirror includes one or more of the previous embodiments and a combined thickness of the binder layer, the reflective layer, the protective layer, and the top layer may vary by no more than about 2%, no more than about 1.5%, or no more than about 1% across a surface area of the top layer.

The optical mirror may comprise one or more of the previous embodiments and the first predetermined rate is optionally no more than about 5 angstroms per second.

In some optional embodiments, the first predetermined rate at which the binder layer is deposited is between about 0.1 angstrom per second and about 5.0 angstroms per second.

The optical mirror optionally includes any one or more of the previous embodiments and the second predetermined rate is at least about 15 angstroms per second.

In some embodiments, the second predetermined rate at which the reflective layer is deposited is optionally between about 15 angstroms per second and about 50 angstroms per second.

In some embodiments, the reflective layer is deposited by a vacuum deposition aluminum silvering process.

The optical mirror may comprise any one or more of the previous embodiments, and optionally the protective layer is deposited on the reflective layer by ion-aided deposition. The ion-aided deposition is optionally argon ion-aided deposition.

In some embodiments, the protective layer is deposited on the reflective layer at a rate of between about 2 angstroms per second and about 5 angstroms per second.

The optical mirror may include one or more of the previous embodiments and optionally the protective layer is a first protective layer and the optical mirror further comprises a second protective layer positioned between the first protective layer and the top layer. The first protective layer may thus optionally be a lower protective layer and the second protective layer may thus optionally be an upper protective layer.

In some embodiments, the first protective layer is applied to the reflective layer by ion-aided deposition.

The first protective layer optionally has a first thickness of between about 950 angstroms and about 1750 angstroms.

The second protective layer is optionally applied to the first protective layer by a non-ion-aided vacuum deposition process.

The second protective layer optionally has a second thickness of between about 1 angstrom and about 600 angstroms.

In some embodiments, the top layer is deposited by ion-aided deposition. Optionally, an argon ion-aided deposition method is used to deposit the top layer.

The optical mirror may include one or more of the previous embodiments and the top layer may optionally comprise one of: Substance WR4-SF Patinal®, Surfclear 100A, and Surfclear 300. The optical mirror optionally comprises one or more of the previous embodiments and the base layer comprises a glass.

Alternatively, in some embodiments, the base layer comprises a plastic, a metal, or a polymer.

In some embodiments, an average reflectivity of the optical mirror is at least about 85% over a wavelength range between 450 nanometers and 650 nanometers.

In certain embodiments, a water contact angle on a surface of the top layer is at least about 90°. Additionally, or alternatively, an oil contact angle on the surface of the top layer is at least about 70°.

The optical mirror may include one or more of the previous embodiments and optionally the protective layer is cleaned before the top layer is applied atop the protective layer.

In some embodiments, the protective layer is cleaned by an ion cleaning method.

Optionally, the ion source for the ion cleaning method is the same as used to deposit one or more layers of the optical mirror by ion-aided deposition.

In some embodiments, the ion source for the ion cleaning method is argon.

The optical mirror optionally includes one or more of the previous embodiments and further comprises a front surface that is concave.

In certain embodiments, the front surface has a radius of curvature of between about 9 feet and about 12 feet.

In some embodiments, the optical mirror includes one or more of the previous embodiments and a shape of the front surface is adapted to collimate light scattered from a diffusion screen that is illuminated by a projector.

The optical mirror may include one or more of the previous embodiments and the front surface has a shape that includes at least a section of a sphere, a parabolic, an ellipsoid, and combinations thereof.

In some embodiments, the optical mirror comprises a body with a first side opposite a second side. Optionally, the first side is congruent to the second side. Additionally, or alternatively, the first and second sides may be oriented approximately perpendicular to the front surface of the mirror.

In certain embodiments, the optical mirror comprises one or more of the previous embodiments and the base layer is a portion of the body. Alternatively, in another embodiment, the base layer is formed of a first material and the body comprises a second material that is different from the first material. The base layer is joined or interconnected to the body.

In some embodiments, the base layer is joined or interconnected to the body before the binder layer is bonded to the base layer.

Alternatively, the base layer is joined or interconnected to the body after one or more of the binder layer, the reflective layer, the protective layer, and the top layer are applied to the base layer.

In another aspect of the present disclosure, a coating for an optical mirror comprises: (1) a binder layer, comprising aluminum metal, deposited on an underlying substrate at a first rate; (2) a reflective layer, overlying the binder layer, comprising aluminum metal, deposited at a second rate; (3) a protective layer, overlying the reflective layer, comprising silicon dioxide; and (4) a top layer, overlying the protective layer, wherein the top layer is at least one of oleophobic and hydrophobic.

In certain embodiments, at least one of the binder layer and the protective layer may be deposited via ion-aided deposition. The ion-aided deposition may, but need not, be argon ion-aided deposition.

In certain embodiments, at least one of the following may be true: (i) a thickness of the binder layer is between about 50 angstroms and about 450 angstroms; (ii) a thickness of the reflective layer is between about 500 angstroms and about 900 angstroms; (iii) a thickness of the protective layer is between about 950 angstroms and about 2350 angstroms; and (iv) a thickness of the top layer is between about 100 angstroms and about 300 angstroms.

In certain embodiments, a combined thickness of the binder layer, the reflective layer, the protective layer, and the top layer may vary by no more than about 2%, no more than about 1.5%, or no more than about 1% across a surface area of the coating.

The coating may comprise one or more of the previous embodiments, and the first rate at which the binder layer is deposited is no more than about 5 angstroms per second.

In some embodiments, the first rate at which the binder layer is deposited on the base layer is between about 0.1 angstrom per second and about 5.0 angstroms per second.

In certain embodiments, the coating optionally includes any one or more of the previous embodiments, and the second rate may be at least about 15 angstroms per second. In some embodiments, the reflective layer may be deposited at the second rate of between about 15 angstroms per second and about 50 angstroms per second.

In some embodiments, the reflective layer is deposited by a vacuum deposition aluminum silvering process.

The coating may comprise any one or more of the previous embodiments, and optionally the protective layer is deposited on the reflective layer by ion-aided deposition. The ion-aided deposition is optionally argon ion-aided deposition.

The coating may include one or more of the previous embodiments and optionally the protective layer is a first protective layer and the coating further comprises a second protective layer positioned between the first protective layer and the top layer. The first protective layer may thus optionally be a lower protective layer and the second protective layer may thus optionally be an upper protective layer.

In another aspect of the present disclosure, a method for making an optical mirror comprises: (a) applying a binder layer comprising aluminum metal to a substrate at a first rate; (b) applying a reflective layer comprising aluminum metal atop the binder layer at a second rate; (c) applying a protective layer comprising silicon dioxide atop the reflective layer to form an uncoated optical mirror; and (d) applying a top layer atop the protective layer, wherein the top layer is at least one of oleophobic and hydrophobic to form the coated optical mirror.

In certain embodiments, at least one of the binder layer and the protective layer may be deposited via ion-aided deposition. The ion-aided deposition may, but need not, be argon ion-aided deposition.

In certain embodiments, at least one of the following may be true: (i) a thickness of the binder layer is between about 50 angstroms and about 450 angstroms; (ii) a thickness of the reflective layer is between about 500 angstroms and about 900 angstroms; (iii) a thickness of the protective layer is between about 950 angstroms and about 2350 angstroms; and (iv) a thickness of the top layer is between about 100 angstroms and about 300 angstroms.

In certain embodiments, a combined thickness of the binder layer, the reflective layer, the protective layer, and the top layer may vary by no more than about 2%, no more than about 1.5%, or no more than about 1% across a surface area of the substrate.

In certain embodiments, an oleophobic/hydrophobic material of the top layer may be selected from the group consisting of Substance WR4-SF Patinal®, Surfclear 100, and Surfclear 300.

In certain embodiments, an average reflectivity of the optical mirror, over a wavelength range between 450 nanometers and 650 nanometers, may be at least about 85%.

In embodiments, the optical mirror optionally includes one or more of the previous embodiments and further comprises a front surface that is concave.

In certain embodiments, a radius of curvature of a front surface of the optical mirror may be at least about 9.25 feet.

In certain embodiments, the front surface has a radius of curvature of between about 9 feet 21 and about 12 feet.

In certain embodiments, a water contact angle on the front surface of the optical mirror may be at least about 90°.

In certain embodiments, an oil contact angle on the front surface of the optical mirror may be at least about 70°.

In certain embodiments, a vacuum chamber in which steps (c) and (d) are carried out may not be purged or vented between steps (c) and (d).

The method may comprise one or more of the previous embodiments, and may further comprise, between steps (c) and (d), ion-cleaning the uncoated optical mirror. A duration of the ion-cleaning step may optionally, but need not, be between about 1 minute and about 30 minutes. The ion-cleaning step may optionally, but need not, be an argon ion cleaning step.

The method may include one or more of the previous embodiments and optionally the protective layer is a first protective layer and the method further comprises applying a second protective layer positioned between the first protective layer and the top layer. The first protective layer may thus optionally be a lower protective layer and the second protective layer may thus optionally be an upper protective layer.

In some embodiments, the first protective layer is applied to the reflective layer by ion-aided deposition.

The first protective layer optionally has a first thickness of between about 950 angstroms and about 1750 angstroms.

The second protective layer is optionally applied to the first protective layer by a non-ion-aided vacuum deposition process.

The second protective layer optionally has a second thickness of between about 1 angstrom and about 600 angstroms.

The method may comprise one or more of the previous embodiments, and may further comprise depositing the binder layer at the first rate of no more than about 5 angstroms per second.

In some embodiments, the first rate at which the binder layer is deposited on the substrate is between about 0.1 angstrom per second and about 5.0 angstroms per second.

In certain embodiments, the method optionally includes any one or more of the previous embodiments, and the second rate may be at least about 15 angstroms per second.

In some embodiments, the second rate at which the reflective layer is deposited is between about 15 angstroms per second and about 50 angstroms per second.

In some embodiments, the reflective layer is deposited by a vacuum deposition aluminum silvering process.

In certain embodiments, a time interval between steps (c) and (d) may be no more than about 60 minutes.

The method may comprise any one or more of the previous embodiments, and optionally the protective layer is deposited on the reflective layer by ion-aided deposition. The ion-aided deposition is optionally argon ion-aided deposition.

In some embodiments, the method comprises any one or more of the previous embodiments and further comprises depositing the top layer by ion-aided deposition.

Optionally, an argon ion-aided deposition method is used to deposit the top layer.

In some embodiment, the method further comprises providing the substrate formed of a glass.

Alternatively, in some embodiments, the method further comprises providing the substrate formed of a plastic, a metal, or a polymer.

The method optionally includes one or more of the previous embodiments, and further comprises joining the substrate to a body of the optical mirror.

In some embodiments, the substrate is joined or interconnected to the body before the binder layer is applied to the substrate.

Alternatively, the substrate is joined or interconnected to the body after one or more of the binder layer, the reflective layer, the protective layer, and the top layer are applied to the substrate.

One aspect of the present disclosure is a mirror as substantially described herein. The mirror may include any of the aspects and embodiments described herein. The mirror may be formed by any method or combination of methods described herein.

Another aspect of the present disclosure is a coating for an optical mirror as substantially described herein. The coating may include any of the aspects and embodiments described herein. The coating may be applied to the optical mirror by any method or combination of methods described herein.

One aspect is a mirror with a coating as substantially described herein.

Still another aspect of the present disclosure is a method of making a coated optical mirror as substantially described herein. The method may include any of the aspect and embodiments described herein.

Yet another aspect is a mirror produced substantially according to a method described herein.

The advantages of the present invention will be apparent from the disclosure contained herein.

As used herein, "at least one," "one or more," and "and/or" are open-ended expressions that are both conjunctive and disjunctive in operation. For example, each of the expressions "at least one of A, B, and C," "at least one of A, B, or C," one or more of A, B, and C," "one or more of A, B, or C," and "A, B, and/or C" means A alone, B alone, C alone, A and B together, A and C together, B and C together, or A, B, and C together.

It is to be noted that the term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

Unless otherwise indicated, all numbers expressing quantities, dimensions, conditions, ratios, ranges, and so forth used in the specification and claims are to be understood as being modified in all instances by the term "about" or "approximately". Accordingly, unless otherwise indicated, all numbers expressing quantities, dimensions, conditions, ratios, ranges, and so forth used in the specification and claims may be increased or decreased by approximately 5% to achieve satisfactory results. Additionally, where the meaning of the terms "about" or "approximately" as used herein would not otherwise be apparent to one of ordinary skill in the art, the terms "about" and "approximately" should be interpreted as meaning within plus or minus 10% of the stated value.

All ranges described herein may be reduced to any sub-range or portion of the range, or to any value within the range without deviating from the invention. For example, the range "5 to 55" includes, but is not limited to, the sub-ranges "5 to 20" as well as "17 to 54."

Unless otherwise indicated, the term "substantially" indicates a different of from 0% to 5% of the stated value is acceptable.

The embodiments and configurations described herein are neither complete nor exhaustive. As will be appreciated, other embodiments of the invention are possible utilizing, alone or in combination, one or more of the features set forth above or described in detail below.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 3 is an illustration of a method for making a mirror with an energetically bonded O/H coating, according to embodiments of the present disclosure.

FIG. 4 is an illustration of another method for making a mirror with an energetically bonded O/H coating, according to embodiments of the present disclosure.

FIGS. 6A and 6B are perspective views of a conventional mirror and a mirror having an energetically bonded O/H coating according to embodiments of the present disclosure, respectively, with droplets of water applied to the surfaces thereof.

FIGS. 7A and 7B are closeup views of the conventional mirror of FIG. 6A and the mirror having an energetically bonded O/H coating of FIG. 6B, respectively, with droplets of water applied to the surfaces thereof.

DETAILED DESCRIPTION

Figure 1:
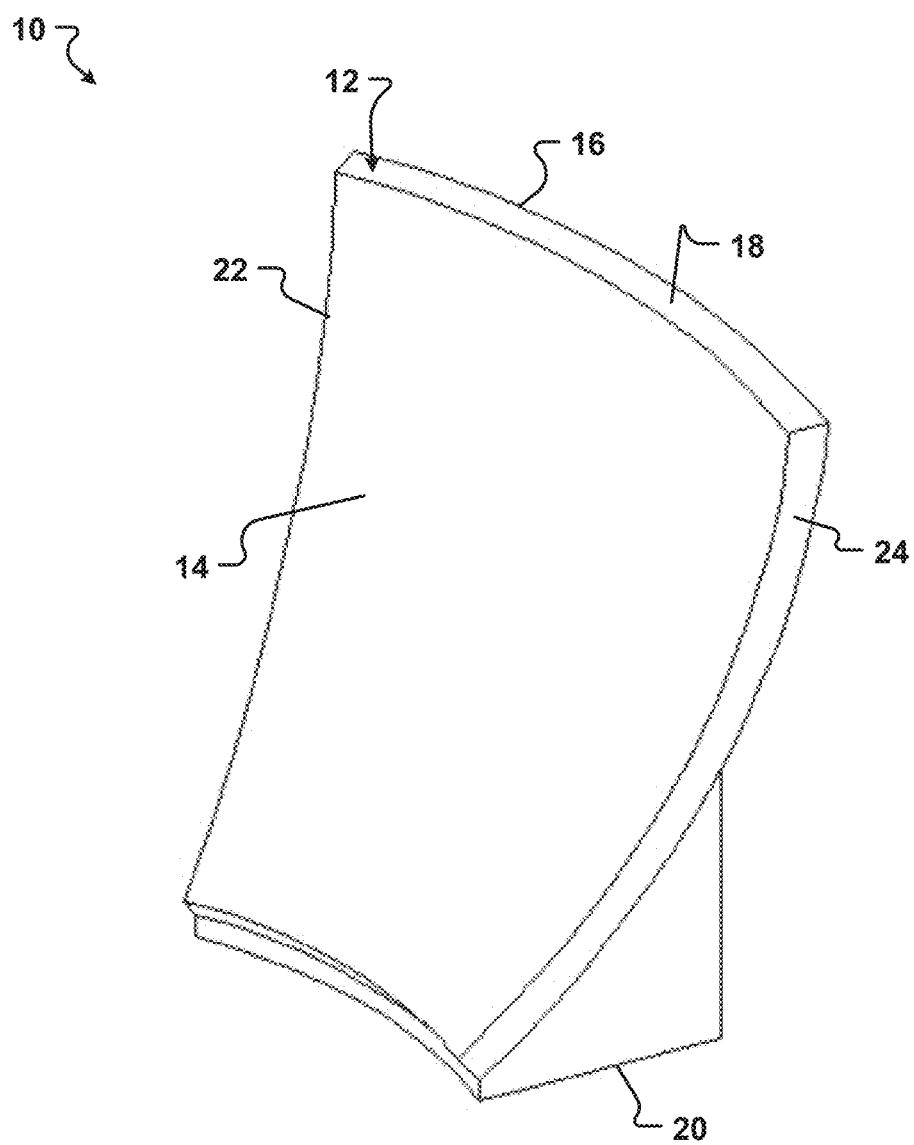
FIG. 1 is a perspective view of a mirror according to embodiments of the present disclosure.

Unless defined otherwise, all technical and scientific terms used herein have the same meaning as is commonly understood by one of ordinary skill in the art. All patents, applications, published applications, and other publications to which reference is made herein are incorporated by reference in their entirety. If there is a plurality of definitions for a term herein, the definition provided in the Summary prevails unless otherwise stated.

As used herein, unless otherwise specified, the term "hydrophobic" refers to a material that appears or tends to repel water, or appears or tends to be repelled from water, or to which water tends to adhere poorly.

As used herein, unless otherwise specified, the term "oleophobic" refers to a material that appears or tends to repel oils and oily substances, or appears or tends to be repelled from oils and oily substances, or to which oils and oily substances tend to adhere poorly.

As used herein, unless otherwise specified, the terms "oleophobic/hydrophobic" and "O/H" are interchangeable and each refer to a material that is oleophobic, or hydrophobic, or both.

As used herein, unless otherwise specified, the term "specular reflection" refers to the reflection of light from a surface at the same angle to the surface normal as the incident ray, but on the opposing side of the surface normal in the plane formed by the incident and reflected rays. Reflection that is not specular is "diffuse reflection."

For purposes of further disclosure and to comply with applicable written description and enablement requirements, the following references generally relate to oleophobic and/or hydrophobic coatings, protective coatings for optical-quality mirrors, and related compositions, devices, methods, and systems, and are hereby incorporated by reference in their entireties:

Military Specification MIL-M-13508C, Mirror, Front Surface Aluminized: For Optical Elements, United States Army Research, Development, and Engineering Command, 19 Mar. 1973.

Military Specification MIL-C-675C, Coating of Glass Optical Elements (Anti-Reflection), United States Army Research, Development, and Engineering Command, 22 Aug. 1980.

U.S. Pat. No. 7,055,954, entitled "Scratch masking coatings for optical substrates," issued 6 Jun. 2006 to Marechal ("Marechal").

U.S. Pat. No. 7,629,053, entitled "Process for treating an ophthalmic lens," issued 8 Dec. 2009 to Lacan et al. ("Lacan").

U.S. Pat. No. 9,896,549, entitled "Hydrophobic and oleophobic coatings," issued 20 Feb. 2018 to Kessman et al. ("Kessman").

The present disclosure provides protective coatings for surfaces of substrates, particularly glass substrates and even more particularly optical mirrors, that include a plurality of layers. The coating layers include energetically bonded layers of aluminum and of oleophobic/hydrophobic (O/H) materials, and provide the mirror with improved resistance to abrasion and physical degradation, cleanability, resistance to blurring, and adhesion of the coating to the substrate. The disclosure also provides methods of forming and using such protective coatings.

The application of the coatings of the present disclosure to optical-quality mirrors increases the mirror's cleanability and useful lifespan and decreases the likelihood that the mirror will be damaged by environmental contaminants and the susceptibility of the mirror to reflection haze and transmission haze. Methods for depositing the coatings on substrates can be easily incorporated into or adapted from existing methods for making such mirrors and can provide mirrors having these and other advantages and benefits with minimal additional time (in some embodiments, about 10 minutes) and cost (in some embodiments, about $200).

Accumulated water on the surface of an optical-quality mirror can, with time, penetrate the top layers of the mirror's coating and cause chemical or physical degradation of the layers. Additionally, prolonged contact between the top surface of the coating and water can cause contaminants dissolved within the water to leach into and be absorbed by the coating, causing a "blue haze" or "white haze" phenomenon that not only degrades the reflectivity of the mirror but can be extremely difficult to clean or remove from the mirror without abrading or damaging portions of the coating itself. Thus, in embodiments, the present disclosure may provide the important advantage and benefit of improving the hydrophobicity of mirror coatings to reduce the amount of water that may accumulate on the surface and the length of time that such water may remain before falling away from the surface or otherwise being removed.

Referring now to FIG. 1, an embodiment of a mirror 10 of the present disclosure is generally illustrated. The mirror 10 generally includes a body 12 with a front portion 14 opposite a rear surface 16, a top surface 18 opposite a bottom surface 20, and a first side 22 opposite a second side 24. The body 12 may have any desired shape and geometry. In embodiments, the body 12 is formed of one or more a glass, a metal, a polymer, and a plastic.

The front portion 14 may have any predetermined shape. In embodiments, the front portion 14 is curved. For example, the front portion 14 may be generally concave. The front portion 14 may have a shape that is spherical, elliptical, freeform, flat, and other geometries known to those of skill in the art. In embodiments, the front portion 14 of the mirror body 12 has a shape that includes at least a section of a circle, a sphere, a parabolic, an ellipsoid, a plane, a freeform, and combinations thereof. In some embodiments, the front portion 14 has a geometry adapted to collimate light from a projector to a user facing the front surface.

The front portion 14 may have a predetermined radius of curvature. In embodiments, the front portion 14 has a radius of curvature of between about 9 feet and about 12 feet. Optionally, the radius of curvature is about 9.25 feet, about 10 feet, or about 11 feet. In other embodiments, the radius of curvature may be less than 9 feet or greater than 12 feet.

As generally depicted in FIG. 1, in embodiments, the first and second sides 22, 24 of the mirror body 12 are oriented generally vertically. In embodiments, the first side 22 is a mirror-image of (or congruent to) the second side 24. In addition, the sides 22, 24 are optionally planar. The sides 22, 24 may also be described as having a radial shape that is aligned with a center of curvature of the front portion 14 so that the sides of the mirror body 12 match sides of adjacent mirror bodies when positioned in a mirror array comprising a plurality of mirror bodies. The radial sides 22, 24 may be approximately perpendicular, or "plumb," in relation to the front portion 14.

Figure 2B:
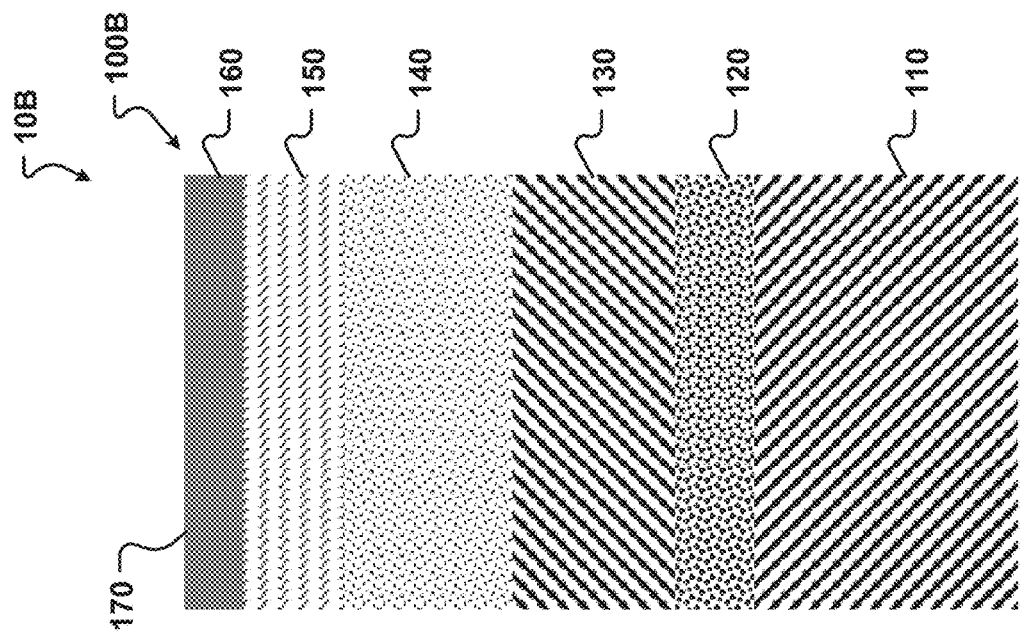
FIG. 2B is an illustration of the layers of another mirror having an energetically bonded O/H coating, according to embodiments of the present disclosure.
Figure 2A:
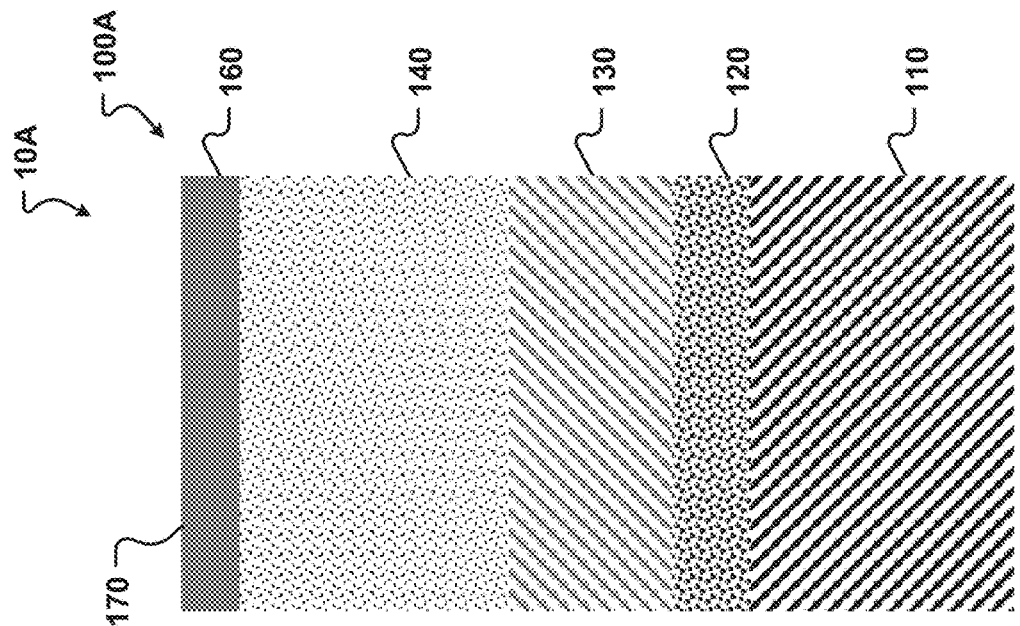
FIG. 2A is an illustration of the layers of a mirror having an energetically bonded O/H coating, according to embodiments of the present disclosure.

Referring now to FIG. 2A, an embodiment of a coating 100A on a front portion 14 of a mirror 10A is generally illustrated. The coating 100A includes an energetically bonded O/H top layer 160. More specifically, front portion 14 comprises a base layer (or substrate layer) 110, a binder layer 120, a reflective layer 130, a protective layer 140, and a top layer (or O/H layer) 160.

The base layer 110 is a substrate to which the coating 100A of the disclosure (i.e. a coating comprising the binder layer 120, the reflective layer 130, the protective layer 140, and the top layer 160) may be applied. The base layer 110 may be a portion of the mirror body 12. Alternatively, the base layer 110 may be a material joined or attached to the mirror body 12. For example, in some embodiments, the base layer 110 is formed of a first material and the mirror body 12 is formed of a second different material.

The base layer 110 is most commonly made entirely or primarily of glass, but may in embodiments be made entirely or primarily of any of a number of other suitable materials, including but not limited to metals, metal alloys, and/or plastics. Properties of the base layer 110 may be selected or controlled to provide a mirror of a desired quality or having a desired characteristic; particularly, the surface quality (i.e. the deviation from an ideal shape) of the base layer 110 influences such characteristics as distortion, artifacts, aberration, coherence, collimation, and divergence, and the surface roughness of the base layer 110 determines how much of the reflection is specular and how much is diffuse, thereby controlling the sharpness (or blurriness) of the image.

As described further herein, the coatings of the present disclosure, and methods of making and applying such coatings, are particularly advantageous in that they do not result in significant alteration of the surface quality, scratching, or gouging of the base layer 110, thereby minimizing the surface roughness introduced by the coating process. It is to be expressly understood that the base layer 110 (and thus the mirror 10A as a whole) may be of any suitable material, length, width, or area. By way of non-limiting example, mirrors 10 for use in, e.g., flight vehicle simulators (FVSs) may have a radius of curvature that is about 9.25 feet, about 10 feet, or about 11 feet.

The binder layer 120 lies atop the base layer 110 and is the first layer of the coating 100A to be deposited on the base layer 110. The primary purpose of the binder layer 120 is to improve adhesion between the subsequently deposited layers of the coating (i.e. the reflective layer 130, the protective layer 140, and the top layer 160) and the base layer 110. This effect is achieved by providing the binder layer 120 in the form of a thin layer—e.g. between about 50 angstroms and about 450 angstroms, most commonly about 250 angstroms—of aluminum metal, and particularly by energetically bonding the aluminum binder layer 120 to the base layer 110. This energetic bonding can be accomplished by depositing the binder layer 120 on the base layer 110 via vacuum deposition, and in some embodiments, by ion-aided deposition (IAD). IAD is a type of vacuum deposition process in which the substrate is continually or periodically bombarded with high-energy particles during deposition, resulting in deposition of atomic-sized energetic particles of a deposited condensing film material. The energetic particles with which the substrate is bombarded are usually ions of an inert gas, but can also be ions of a reactive gas or of the condensing film material itself. In some embodiments, the ions may be argon ions, and thus the process may be referred to as "argon IAD."

Those skilled in the art will be able to select appropriate operating parameters for the IAD process of depositing the binder layer 120, but the present inventor has discovered that one important consideration for this step is a relatively low rate of deposition. By way of non-limiting example, the binder layer 120 may be deposited on the base layer 110 at a rate of no more than about 5.0 angstroms per second, no more than about 4.5 angstroms per second, no more than about 4.0 angstroms per second, no more than about 3.5 angstroms per second, no more than about 3.0 angstroms per second, no more than about 2.5 angstroms per second, no more than about 2.0 angstroms per second, no more than about 1.5 angstroms per second, no more than about 1.0 angstroms per second, or about 0.5 angstroms per second. In some embodiments, the binder layer 120 is deposited on the base layer 110 at a rate of between about 0.1 angstrom per second and about 5.0 angstroms per second. Without wishing to be bound by any particular theory, it is hypothesized that these relatively low deposition rates provide the greatest degree of energetic bonding between the binder layer 120 and the base layer 110, and thus the greatest improvement in adhesion between the subsequently deposited layers of the coating and the base layer 110.

The reflective layer 130 lies atop, and is deposited after deposition of, the binder layer 120. The reflective layer 130—which, like the binder layer 120, comprises aluminum metal—is the light-reflecting portion of the mirror 10A, i.e. enhances the reflectivity of the base layer 110 and thus the mirror 10A as a whole. Aluminum is well-known as a "silvering" material for conventional optical-quality mirrors for many instruments, particularly telescopes; it is harder and less expensive than silver and reflects 85% to 90% of incoming visible light, and although it tarnishes relatively quickly, this tarnish (i.e. aluminum oxide) is itself transparent and so does not impede the reflectivity of the coating. The reflective layer 130 is generally thicker than the binder layer 120, usually between about 500 angstroms and about 900 angstroms and most commonly about 700 angstroms.

The reflective layer 130 may be deposited by conventional vacuum deposition aluminum silvering processes, as are well-known and widely practiced in the art. However, the present inventor has discovered that, unlike the binder layer 120, the reflective layer 130 generally benefits from a relatively high rate of deposition.

By way of non-limiting example, the reflective layer 130 may be deposited at a rate of at least about 15 angstroms per second, at least about 20 angstroms per second, at least about 25 angstroms per second, at least about 30 angstroms per second, at least about 35 angstroms per second, at least about 40 angstroms per second, at least about 45 angstroms per second, or about 50 angstroms per second. In some embodiments, the reflective layer 130 is deposited at a rate of between about 15 angstroms per second and about 50 angstroms per second. Without wishing to be bound by any particular theory, it is hypothesized that these relatively high deposition rates allow the reflective layer 130 to be energetically bonded to the binder layer 120 without interfering with the energetic bonding between the binder layer 120 and the base layer 110, thereby preserving the improved adhesive effect of the binder layer 120.

The protective layer 140 lies atop, and is deposited after deposition of, the reflective layer 130. The material of the protective layer 140, typically silicon dioxide, may serve a dual purpose: it is generally a hard material that protects the reflective layer 130 from damage and improves the durability, resistance to abrasion, etc. of the mirror 10A as a whole, but may also be a dielectric material and thus greatly enhance the reflectivity of the mirror 10A at a desired wavelength or wavelengths. The thickness of the protective layer 140 may be selected so as to provide a desired dielectric effect, but in general the protective layer 140 may be significantly thicker than the binder layer 120 and/or reflective layer 130. In embodiments, a thickness of the protective layer 140 may be between about 950 angstroms and about 2350 angstroms, most commonly about 1650 angstroms.

The protective layer 140 is, like the binder layer 120, most advantageously deposited by IAD. The rate of deposition of the protective layer 140 is not critical, and any suitable rate, as known and described in the art, may be selected for a desired application. In some embodiments, a relatively low deposition rate, e.g. of between about 2 angstroms per second and about 5 angstroms per second, or about 2.5 angstroms per second, may be desirable, due to considerations similar to those described above with respect to the binder layer 120.

The top layer 160 lies atop, and is deposited after deposition of, the protective layer 140. The top layer 160 defines an outer surface 170 of the front portion 14 of the mirror 10A.

The top layer 160 is made of an oleophobic/hydrophobic (O/H) material and serves to improve the cleanability and resistance to contamination/fouling of the mirror 10A. Particularly, the O/H top layer 160 causes oily (e.g. oils present on human skin) or aqueous (e.g. environmental water vapor, rainfall, human bodily fluids, etc.) contaminants to "bead" on the surface of the mirror 10A rather than spreading across the surface in a thin layer; the contact area between the contaminant and the surface is thus minimized, making it easier for the contaminant to fall and/or be removed from the surface. The O/H top layer 160 thus extends the useful life of the mirror 10A by reducing both the frequency and the force required to maintain the mirror 10A as clean, thereby reducing the likelihood of damage to the mirror 10A as a result of cleaning.

The rate of deposition of the top layer 160 is not critical, and any suitable rate, as known and described in the art, may be selected for a desired application, but the present inventor has discovered that it is generally advantageous to apply the top layer 160 immediately, or shortly (e.g. within about 60 minutes), after deposition of the protective layer 140. Without wishing to be bound by any particular theory, it is believed that applying the top layer 160 atop a recently deposited protective layer 140 may result in more effective bonding between the protective layer 140 and the top layer 160 and/or more uniform thickness of the top layer 160.

The top layer 160 may be made of any O/H material suitable for making O/H coatings of glass surfaces such as touchscreens, so long as such material can be evaporated (thermally or via electron beam) in the vacuum deposition chamber without causing unwanted byproducts or contaminants to be deposited onto the mirror 10A. Examples of O/H materials suitable for use in the top layer 160 include, but are not limited to, Substance WR4-SF Patinal® (EMD Performance Materials, Darmstadt, Germany), Surfclear 100 (Canon Optron, Inc., Yuki, Japan), and Surfclear 300 (Canon Optron, Inc., Yuki, Japan). A thickness of the top layer 160 may generally be between about 100 angstroms and about 300 angstroms, most commonly about 150 angstroms.

In some embodiments, the efficiency and effectiveness of the top layer 160, and/or the process of deposition thereof, may be improved by conducting an ion cleaning of the mirror 10A after application of the protective layer 140 and before application of the top layer 160. Ion cleaning is, like IAD, a process in which the surface of a substrate is bombarded with energetic atomic-sized particles, but differs in that it does not take place in the presence of a condensing film material. As a result, the ionic bombardment results in atoms or molecules, often contaminant atoms or molecules, being removed from the surface of the substrate. The present inventor has found that incorporation of an ion cleaning step between deposition of the protective layer 140 and deposition of the top layer 160 can beneficially remove contaminants and improve the uniformity of the mirror surface (i.e. to "smoothen," or decrease the roughness of, the mirror surface, which may have been introduced as a result of uneven deposition of the protective layer 140 and/or any of the underlying layers 110, 120, 130) prior to application of the O/H coating 160. In this way, incorporation of an ion cleaning step can provide a mirror 10 having the surface uniformity and optical quality characteristic of high-performance mirrors, while also including the full benefits of the O/H coating discussed throughout this disclosure. In addition, where the ion source is the same as that used to deposit any one or more of the IAD-deposited layers of the mirror (for example, using argon ions for the ion cleaning where the IAD-deposited layers are deposited by argon IAD), the ion cleaning can be performed during the same manufacturing run as the other layer deposition steps and/or without venting the vacuum chamber, further improving the efficiency and cost-effectiveness of the manufacturing method.

One particular advantage and benefit of the mirror 10A and the coating 100A illustrated in FIG. 2A is that it can be provided with an improved O/H effect (provided by the top layer 160) while maintaining a uniform coating thickness across the full area of the mirror 10A. Previous attempts to impart O/H coatings to optical-quality mirrors have generally suffered from very poor coating thickness uniformity. Often, the thickness of the coating in these prior mirrors varied by at least as much as about 6% across the area of the mirror, and such large variations in coating thickness can profoundly degrade the optical performance of the mirror. By contrast, the present inventor has been able to provide mirrors 10A according to the embodiment illustrated in FIG. 2A in which the coating thickness varies by no more than about 2%, and in some cases no more than about 1.5% or no more than about 1%, over the area of the front portion 14 of the mirror, thereby maintaining the mirror's optical quality while providing the desired O/H effect.

Referring now to FIG. 2B, another embodiment of a mirror 10B with a coating 100B comprising an energetically bonded O/H top layer 160 is illustrated. The embodiment illustrated in FIG. 2B is similar to that illustrated in FIG. 2A, except that a portion of the protective layer 140 has been replaced by a second (or upper) protective layer 150. Typically, in mirrors 10B according to the embodiment illustrated in FIG. 2B, the lower protective layer 140 is applied by IAD, while the upper protective layer 150 is applied by a non-ion-aided vacuum deposition process. Without wishing to be bound by any particular theory, it is possible that applying a portion of the protective layer(s) without IAD may provide an advantageous difference in, or combination of, chemical, optical, or physical characteristics between the lower protective layer 140 and the upper protective layer 150.

The thickness of the upper protective layer 150 may generally be between about 1 angstrom and about 600 angstroms, most commonly about 300 angstroms, but the total thickness of the lower and upper protective layers 140, 150 in the embodiment illustrated in FIG. 2B is typically about equal to the thickness of the single protective layer 140 in the embodiment illustrated in FIG. 2A, e.g. between about 950 and about 2350 angstroms and most commonly about 1650 angstroms. As in the embodiment illustrated in FIG. 2A, it may be beneficial, in the process of manufacturing the mirror 10B illustrated in FIG. 2B, to perform an ion cleaning step after deposition of the second/upper protective layer 150 and before deposition of the top layer 160, for any or all of the reasons described above.

Referring now to FIG. 3, a method 300 for applying an energetically bonded O/H coating to a mirror 10 is illustrated. While a general order of the operations of method 300 are shown in FIG. 3, method 300 can include more or fewer operations, or can arrange the order of the operations differently than those shown in FIG. 3. Further, although the operations of method 300 may be described sequentially, one or more the operations may in fact be performed in parallel or concurrently.

In a substrate provision step 310, a substrate or base layer is provided as described above with respect to the base layer 110 illustrated in FIGS. 1 and 2. In some embodiments, the base layer 110 is the front portion 14 of a mirror body 12. Alternatively, the base layer 110 may comprise a piece of material, such as an insert, which will be interconnected to the front portion 14.

In a binder layer depositing step 320, a binder layer is deposited on the base layer 110 as described above with respect to the binder layer 120 illustrated in FIGS. 2A and 2B. In a reflective layer depositing step 330, a reflective layer is deposited atop the binder layer as described above with respect to the reflective layer 130 illustrated in FIGS. 2A and 2B. In a protective layer(s) depositing step 340, at least one protective layer is deposited atop the reflective layer as described above with respect to the protective layer 140 illustrated in FIG. 2A and/or with respect to the lower and upper protective layers 140, 150 illustrated in FIG. 2B. In a top layer depositing step 360, an O/H top layer is deposited atop the protective layer(s) as described above with respect to the top layer 160 illustrated in FIGS. 2A and 2B.

Referring now to FIG. 4, a method 400 for applying an energetically bonded O/H coating to a mirror 10 is illustrated. While a general order of the operations of method 400 are shown in FIG. 4, method 400 can include more or fewer operations, or can arrange the order of the operations differently than those shown in FIG. 4. Further, although the operations of method 400 may be described sequentially, one or more the operations may in fact be performed in parallel or concurrently.

In a substrate provision step 410, a substrate or base layer is provided as described above with respect to the base layer 110 illustrated in FIGS. 2A and 2B. In some embodiments, the base layer 110 is the front portion 14 of a mirror body 12. Alternatively, the base layer 110 may comprise a piece of material, such as an insert, which will be interconnected to the front portion 14.

In a binder layer depositing step 420, a binder layer is deposited on the base layer as described above with respect to the binder layer 120 illustrated in FIGS. 2A and 2B. In a reflective layer depositing step 430, a reflective layer is deposited atop the binder layer as described above with respect to the reflective layer 130 illustrated in FIGS. 2A and 2B. In a protective layer(s) depositing step 440, at least one protective layer is deposited atop the reflective layer as described above with respect to the protective layer 140 illustrated in FIG. 2A and/or with respect to the lower and upper protective layers 140, 150 illustrated in FIG. 2B.

In an argon ion cleaning step 450, the mirror is subjected to an argon ion cleaning process prior to application of the energetically bonded O/H coating for any length of time suitable for cleaning, without undesirably etching, the protective layer 140 (or protective layers 140, 150). In embodiments, the argon ion cleaning may last for between about 1 minute and about 30 minutes, most typically about 15 minutes. In a top layer depositing step 460, an O/H top layer is deposited atop the protective layer(s) as described above with respect to the top layer 160 illustrated in FIGS. 2A and 2B.

The following disclosed Examples illustrate and describe various embodiments and features of the present disclosure.

Example 1: Manufacturing of O/H Coated Mirrors

Mirrors for testing the effectiveness of O/H coatings of the present disclosure were formed by vacuum deposition, and specifically by depositing a 700-angstrom layer of aluminum via high-rate, non-IAD vacuum deposition on a glass substrate, followed by argon IAD of a 1650-angstrom layer of silicon dioxide atop the aluminum layer. Finally, immediately after deposition of the final silicon dioxide layer and without venting the deposition chamber, four tungsten boats (Kurt J. Lesker Company, Jefferson Hills, Pa.) were placed in the resistive source of the S36 coating chamber, and two "pills" or "tablets" of an O/H coating material, specifically Substance WR4-SF Patinal® (EMD Performance Materials, Darmstadt, Germany), were added to each boat. The O/H material was then deposited atop the final silicon dioxide layer via vacuum deposition to form the finished optical-quality mirror having an energetically bonded O/H coating. The coating of the finished mirror included (in ascending order from the substrate) a binder layer of aluminum metal having a thickness of about 250 angstroms (applied at low deposition rate), a reflective layer of aluminum metal having a thickness of about 700 angstroms (applied at high deposition rate), an IAD-deposited protective layer of silicon dioxide having a thickness of about 1350 angstroms, a non-IAD-deposited protective layer of silicon dioxide having a thickness of about 300 angstroms, and an O/H top layer of WR4-SF having a thickness of about 150 angstroms.

The following Examples 2-9 illustrate comparisons between O/H coated mirrors prepared according to this Example and mirrors having a conventional protective coating (i.e. lacking the O/H layer).

Example 2: Abrasion Testing and Qualitative Tactile Evaluation

A mirror produced according to Example 1 and a conventional mirror lacking the O/H layer were subjected to hardness testing according to paragraph 4.4.5 of United States Military Specification MIL-M-13508C, "Mirror, Front Surface Aluminized: For Optical Elements." In this test, a 1-pound test device with a 3/8"-thick pad of cheesecloth was rubbed against the coated surface for 50 passes. Both mirrors met the hardness specification of this test, and neither coating exhibited any sign of damage after the test.

Both mirrors were then subjected to the severe abrasion test of paragraph 4.5.10 of United States Military Specification MIL-C-675C, "Coating of Glass Optical Elements (Anti-Reflection)." In this more aggressive test, which is generally not used to evaluate metallic coatings but reserved for dielectric coatings, a 2.0-pound test device with an eraser end was rubbed against the coated surface for 40 passes. While both mirrors failed this more aggressive test, both performed well by the standards of metallic-coated mirrors.

After the abrasion testing, both mirrors were qualitatively evaluated for tactile characteristics. It was observed that the mirror including the O/H layer produced according to Example 1 felt noticeably "slicker" to the touch than the conventional mirror. Without wishing to be bound by any particular theory, it is believed that this increased "slickness" can cause a potentially abrasive material to be deflected away from the mirror surface more easily, thereby protecting the mirror and O/H coating against scratching.

Example 3: Adhesion Testing

Several conventional mirrors lacking both an O/H layer and an IAD-deposited binder layer were subjected to "tape pull" adherence testing according to MIL-M-13508C, ¶ 4.4.6. In this test, a piece of cellophane tape (Scotch 600) was pressed against the surface and then slowly removed at a 90° angle. Some conventional mirrors passed this test, while others failed. By contrast, several mirrors having an IAD-deposited binder layer (but no O/H layer) were tested according to the same procedure; all of these mirrors passed.

The mirrors having the IAD-deposited binder layer but no O/H layer were then subjected to "tape pull" adhesion testing according to MIL-C-675C, ¶ 4.5.12. In this more aggressive test, which is generally not used to evaluate metallic coatings but reserved for dielectric coatings, a piece of cellophane tape was pressed against the surface and then quickly "snapped" off of the coating. All of the tested mirrors passed. The same test protocol was repeated on the same samples using duct tape, gaffer's tape, electrical tape, packing tape, and Kapton tape in place of the cellophane tape, with the same result—none of the tapes caused removal of the coating from the glass substrate of the mirror.

Figure 5B:
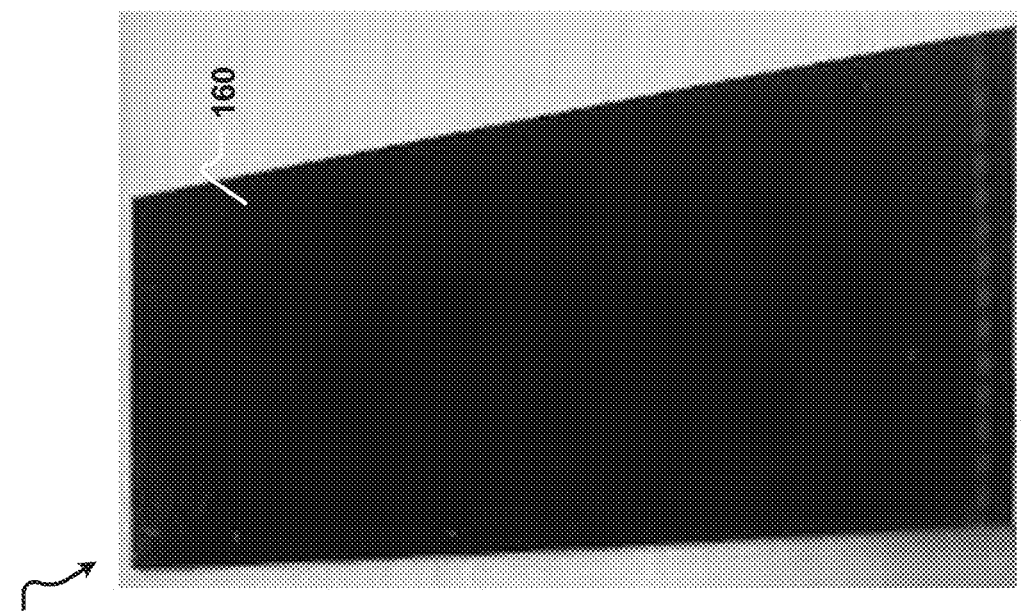
FIGS. 5A and 5B are photographs of a conventional mirror and a mirror having an energetically bonded O/H coating according to embodiments of the present disclosure, respectively, after a "tape pull" adhesion test.
Figure 5A:
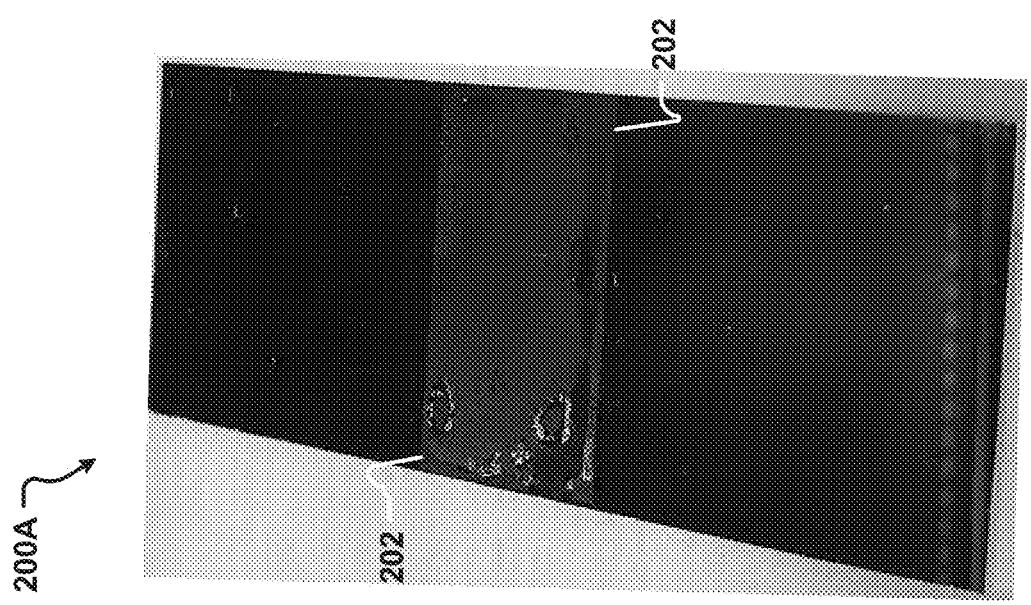

Referring now to FIGS. 5A and 5B, a mirror 200A having the IAD-deposited binder layer but no O/H layer (FIG. 5A) and a mirror 200B produced according to Example 1 (FIG. 5B) were subjected to the tape pull adhesion test of MIL-C-675C, ¶ 4.5.12. While both mirrors 200A, B passed the test, FIG. 5A clearly illustrates a "tacky" residue 202 left behind on the surface of the non-O/H-coated mirror 200A, which required wiping with alcohol to be removed.

By contrast, as FIG. 5B illustrates, the O/H-treated mirror 200B shows no residue left behind by the tape and required no cleaning after the test. It was further observed that the tape could be removed from the O/H-treated mirror 200B with very little effort. This Example thus illustrates that addition of the O/H layer to the mirrors 10, 200B of the present disclosure improves the adhesion performance of optical-quality mirrors by rejecting external adhesive forces.

Example 4: Hydrophobicity Testing

The sample mirrors 200A,B illustrated in FIGS. 5A and 5B were subjected to water bead testing to evaluate their relative hydrophobicity qualities. Specifically, a droplet of water was delivered to the surface of both samples 200A,B via pipet. The droplets applied to both mirrors were of approximately equal volume.

Referring now to FIGS. 6A through 7B, the conformation of the water droplet 204 after application to both samples 200A,B is illustrated. It is readily apparent that whereas the droplet 204A applied to the mirror 200A having no O/H layer (FIGS. 6A and 7A) lay flat and conformed closely to the surface of the mirror 200A, the increased hydrophobicity of the O/H-treated mirror 200B (FIGS. 6B and 7B) results in the formation of a bead 204B that much more closely approximates a spherical conformation.

As best illustrated in FIG. 7B, the contact angle between the water bead 204B and the surface of the O/H-treated mirror 200B is greater than 90°—that is, rather than resting perpendicular to the surface of the mirror 200B (e.g. in a hemispherical conformation), the bead actually curves back under itself. This result is in accordance with the assertion by the manufacturer of the WR4-SF material that it can achieve a water contact angle of 116°.

As illustrated in FIGS. 6A and 7A, the water contact angle of uncoated glasses and glasses having non-hydrophobic coatings (e.g. non-O/H-treated mirrors) is generally about 40°. As a result, whereas water can simply be shaken off of the O/H-treated mirror 200B, the non-O/H-treated mirror 200A had to be wiped or dried to be removed from the surface. The hydrophobic phenomenon illustrated in FIGS. 6B and 7B may thus be particularly useful to improve the resilience of mirrors against large-scale wetting events, as most of any large quantity of water will simply flow or fall away from the hydrophobic surface of the mirror in sheets, allowing the small remainder to be easily removed by wiping, drying, or blowing.

Example 5: Fingerprint Adherence and Removal Testing

A human tester applied both thumbs, which had been rubbed together in an attempt to distribute skin oils equally, to the surfaces of both sample mirrors 200A,B of Example 4 and applied approximately equal pressure for approximately equal times.

Figure 8A:
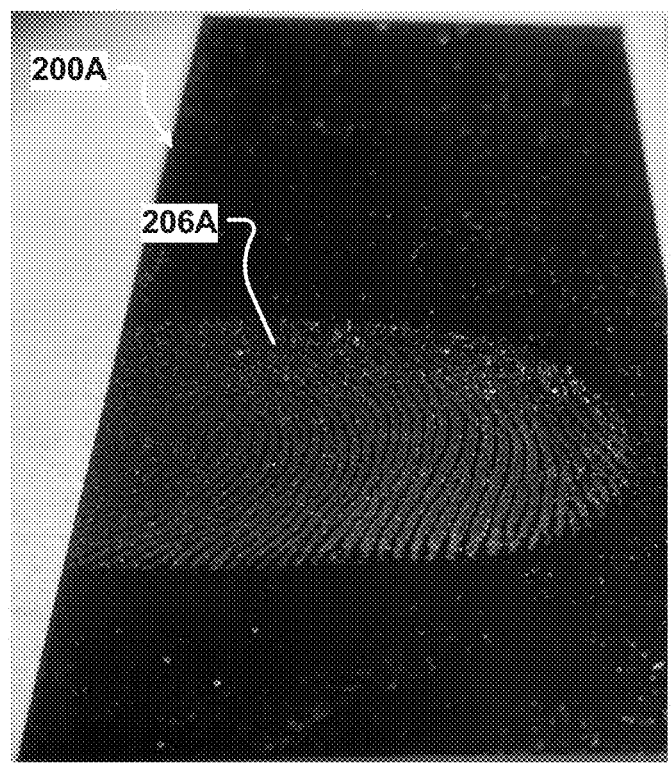
FIGS. 8A and 8B are photographs of a conventional mirror and a mirror having an energetically bonded O/H coating according to embodiments of the present disclosure, respectively, with fingerprints applied to the surfaces thereof.
Figure 8B:
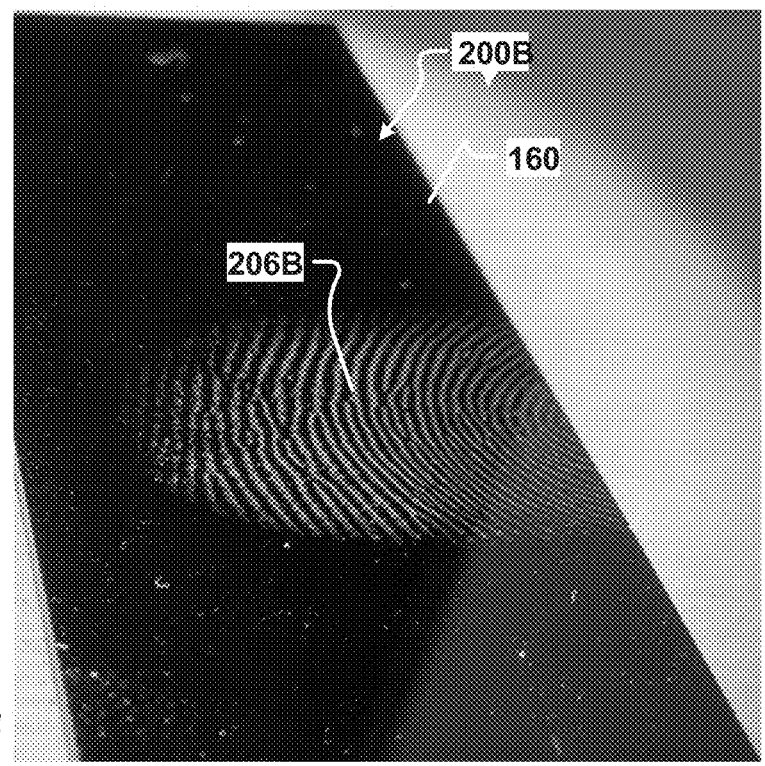

Referring now to FIGS. 8A and 8B, the fingerprints 206 left due to the application of the tester's thumbs on both samples 200A, 200B are illustrated. Although the effect is not as striking as the result of the water bead testing of Example 4, the fingerprint 206B left on the O/H-treated mirror 200B (FIG. 8B) is noticeably less pronounced than the fingerprint 206A left on the non-O/H-treated mirror 200A (FIG. 8A), consistent with the O/H material manufacturer's claims of an oil contact angle of about 70°.

Figure 9A:
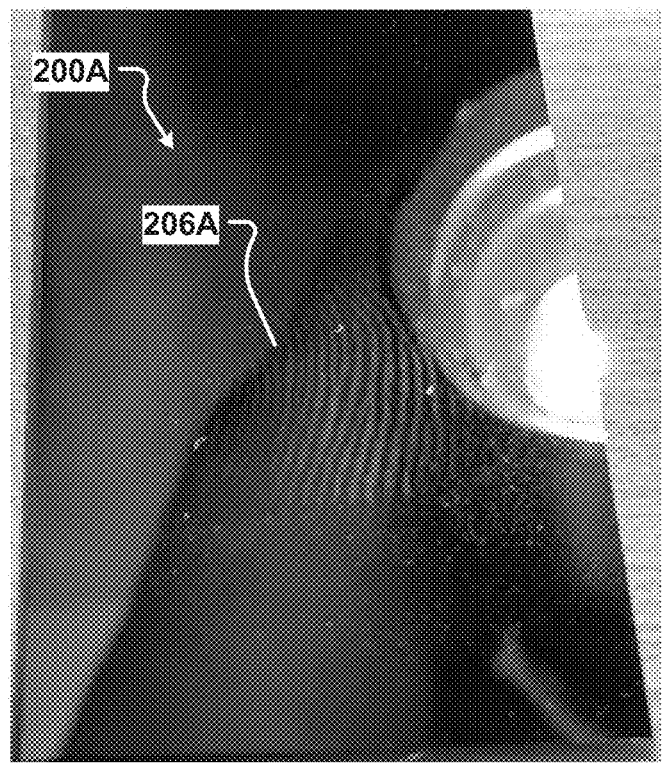
FIGS. 9A and 9B are photographs of the mirrors of FIGS. 8A and 8B, respectively, after rubbing the mirrors with a dry paper towel.
Figure 9B:
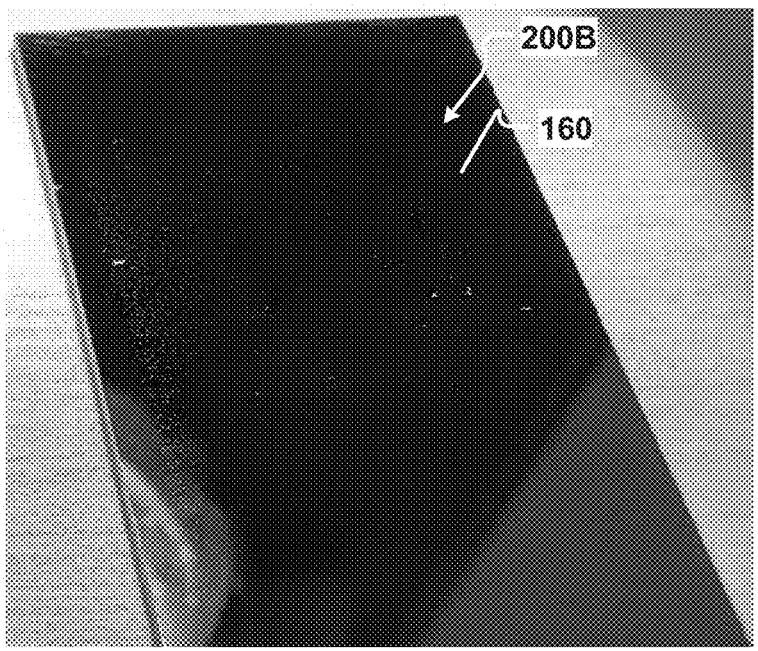

Referring now to FIGS. 9A and 9B, both sample mirrors 200A,B were rubbed with a dry paper towel to attempt to remove the fingerprints 206 from the surfaces. As is clearly seen, the fingerprint is much more completely removed from the O/H-treated sample mirror 200B (FIG. 9B) than from the non-O/H-treated sample mirror 200A (FIG. 9A). Particularly, the non-O/H-treated mirror 200A is left with a hazy bluish residue, which required the application of a foaming spray cleaner to be completely removed. In contrast, the O/H-treated sample mirror 200B did not have any residue and did not require the application of any type of cleaner.

Example 6: Permanent Ink Removal Testing

Figure 10A:
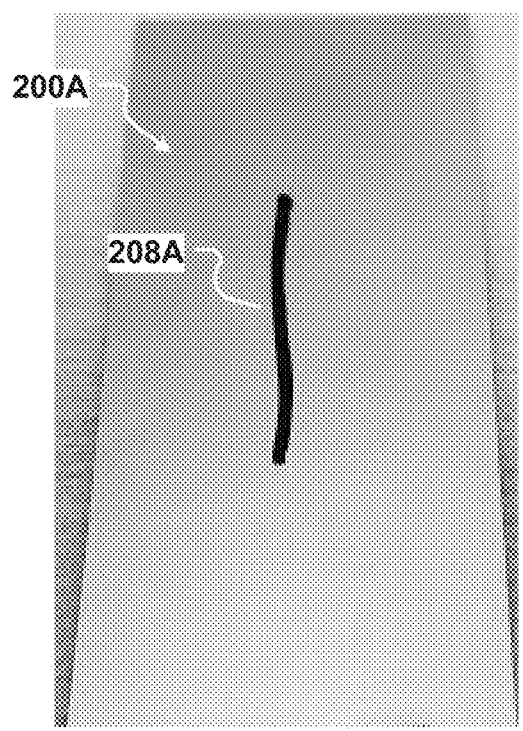
FIGS. 10A and 10B are photographs of a conventional mirror and a mirror having an energetically bonded O/H coating according to embodiments of the present disclosure, respectively, with permanent ink applied to the surfaces thereof.
Figure 10B:
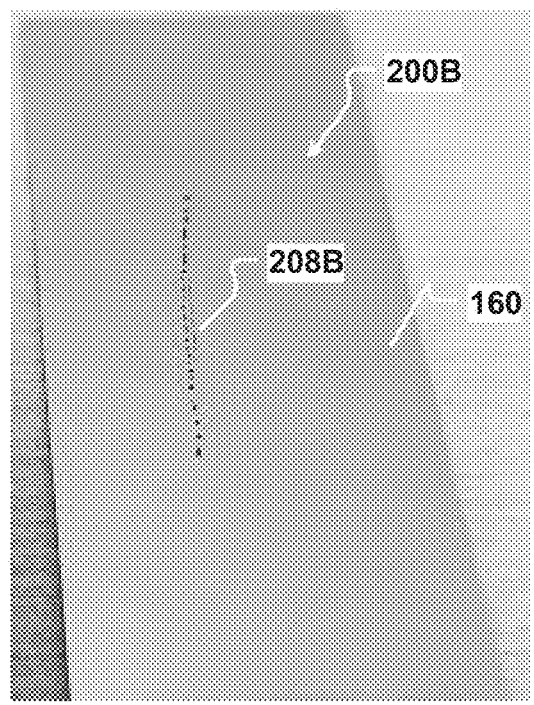

Referring now to FIGS. 10A and 10B, a Fine-tip Sharpie® permanent marker (Newell Brands, Atlanta, Ga.) was used to mark the surfaces of both sample mirrors 200A,B of Example 4. It is readily apparent that whereas the mirror 200A having no O/H layer (FIG. 10A) receives the permanent ink 208A as readily as paper or untreated glass, the increased hydrophobicity and/or oleophobicity of the O/H-treated mirror 200B (FIG. 10B) causes the surface of the mirror 200B to reject the ink 208B and cause the ink to bead on the surface, resulting in a much fainter, lighter mark.

Figure 11A:
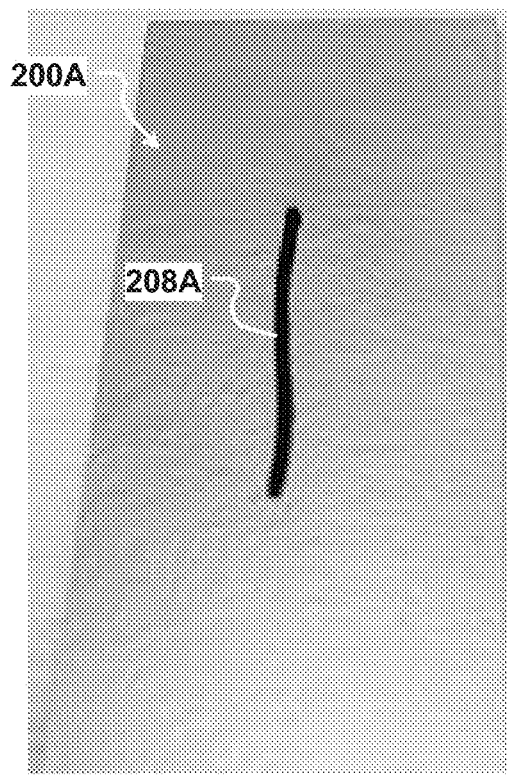
FIGS. 11A and 11B are photographs of the mirrors of FIGS. 10A and 10B, respectively, after rubbing the mirrors with a dry paper towel.
Figure 11B:
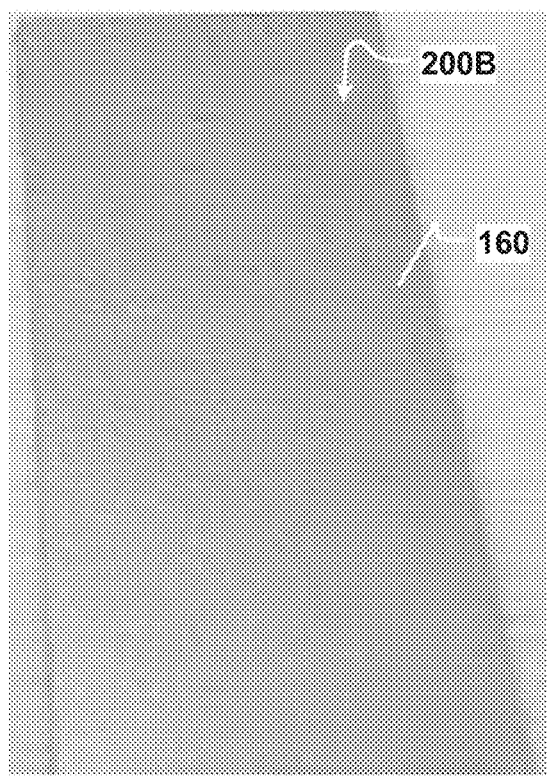

Referring now to FIGS. 11A and 11B, both sample mirrors 200A,B were rubbed with a dry paper towel to attempt to remove the permanent ink 208 from the surface. As is clearly seen, the permanent ink 208A deposited on the mirror 200A having no O/H layer (FIG. 11A) is largely unaffected, and it was possible to remove the ink only with the use of foaming spray cleaner or other similar solvent.

The permanent ink was fully removed, however, from the O/H-treated sample mirror 200B (FIG. 11B) by this dry rub with a paper towel. Upon repeating this test on the O/H-treated sample 200B, it was observed that it was generally easiest to remove the permanent ink from the O/H-treated sample 200B within a short time after application of the ink, as the beaded permanent ink had not yet dried and so could be removed with a dry paper towel with little or no pressure. Removal of the permanent ink after drying required the application of some pressure, but could still be achieved by a dry paper towel without the use of a cleaner or other solvent.

Example 7: Foaming Spray Cleaner Testing

An O/H-treated mirror 200C made according to the procedure of Example 1, having an outer diameter of 150 mm, was subjected to a cleaning procedure in which a foaming spray glass cleaner was applied to the entire surface of the mirror 200C and then wiped off with a dry microfiber mop head as soon as the cleaner foam began to slide down the surface of the mirror 200C. No additional pressure was applied to the mop head. This process was continued until the foaming spray glass cleaner was removed from the entire surface of the mirror 200C.

Figure 12B:
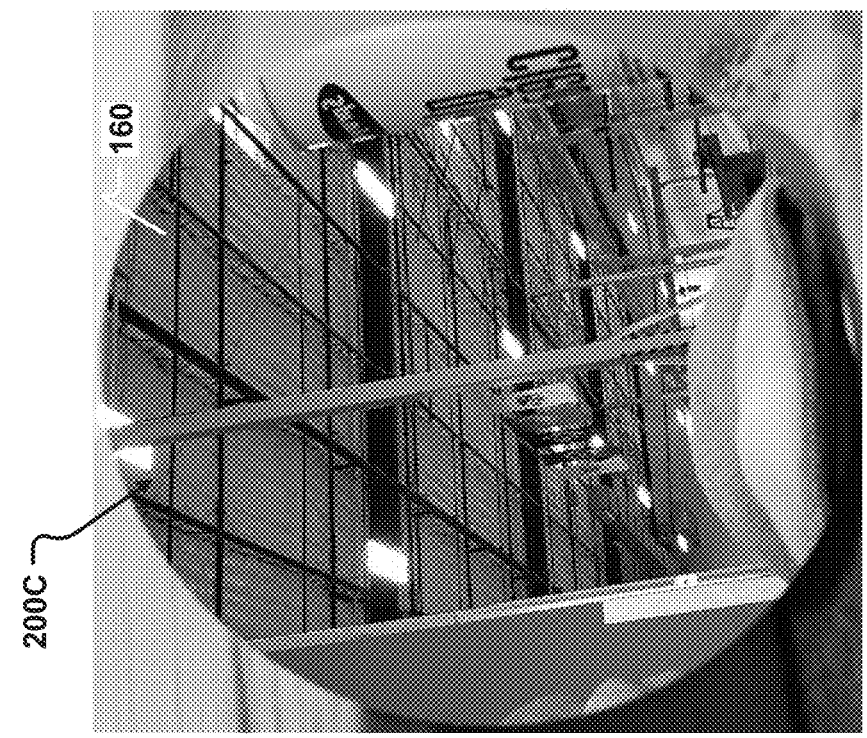
FIGS. 12A and 12B are photographs of a mirror having an energetically bonded O/H coating, according to embodiments of the present disclosure, after application of a foaming spray cleaner and after wiping of the foaming spray cleaner with a dry microfiber cloth, respectively.
Figure 12A:
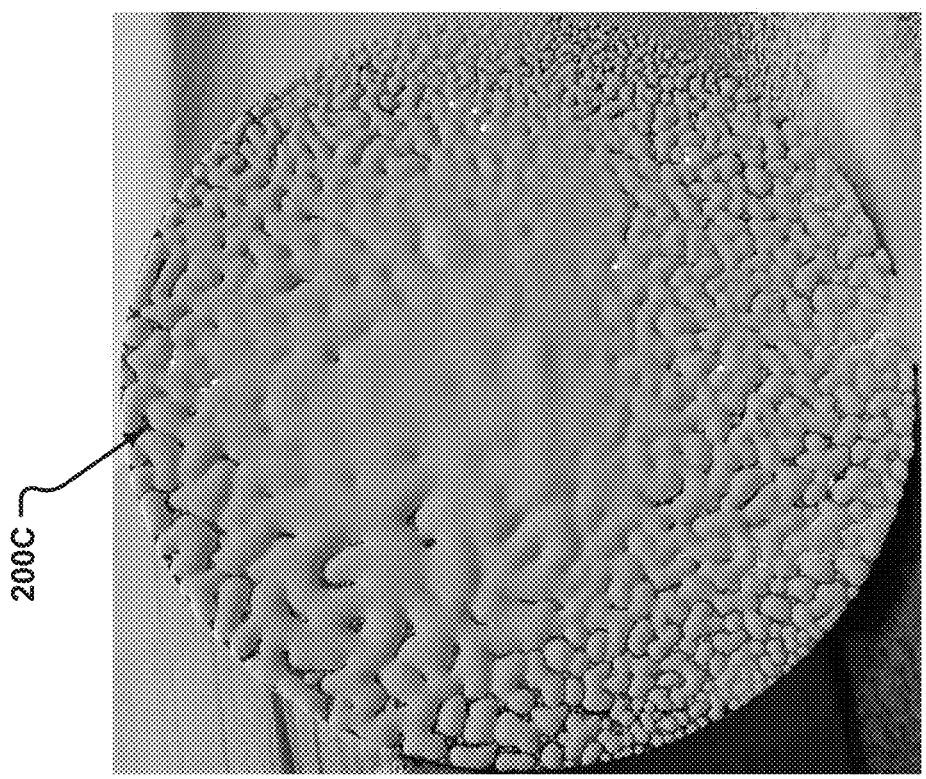

Referring now to FIGS. 12A and 12B, the O/H-treated mirror 200C is shown before (FIG. 12A) and after (FIG. 12B) wiping of the foaming spray cleaner from the surface. As illustrated, it was easily possible to apply the foaming spray cleaner to substantially the entire surface of the mirror 200C and then to remove the cleaner from the surface by wiping; the cleaner left no apparent residue and successfully cleaned contaminants from the surface of the mirror 200C, as expected. It was particularly observed that the mirror 200C, as expected, felt "slicker" than a non-O/H-treated mirror during wiping of the cleaner. Thus, without wishing to be bound by any particular theory, it is possible that removal of foaming spray cleaners and similar solvents and/or surfactants from O/H-treated mirrors may require less wiping force than on non-O/H-treated mirrors, which, as described herein, may protect the mirror against abrasion and extend its useful life.

Example 8: Humidity and Salt Spray Testing

Two mirrors 200F,G produced according to Example 1 and two conventional mirrors 200D,E lacking the O/H layer were subjected to humidity testing according to MIL-M-13508C, ¶ 4.4.7. In this test, the sample mirrors 200D,E,F,G were placed in a specialized cabinet heated to 120° F. and humidified to at least about 95% relative humidity for 24 hours. None of the sample mirrors 200D,E,F,G exhibited evinced degradation of any kind after this test.

The four sample mirrors 200D,E,F,G were then subjected to salt spray testing according to ASTM Standard B117-73, "Standard Method of Salt Spray (Fog) Testing." In this more aggressive test, which is generally not used to evaluate metallic coatings but reserved for dielectric coatings, the sample mirrors were placed in a specialized cabinet heated to 95° F. and exposed to a misted solution of sodium chloride (5%) in water for 24 hours. It is known that conventional optical-quality mirrors having protective coatings are generally poorly resilient to salt spray, and it is thus desirable to identify whether O/H coatings can overcome this drawback and improve the salt spray survivability of optical-quality mirrors (as may be important, e.g., for mirrors that may be exposed to seawater).

Figure 13A:
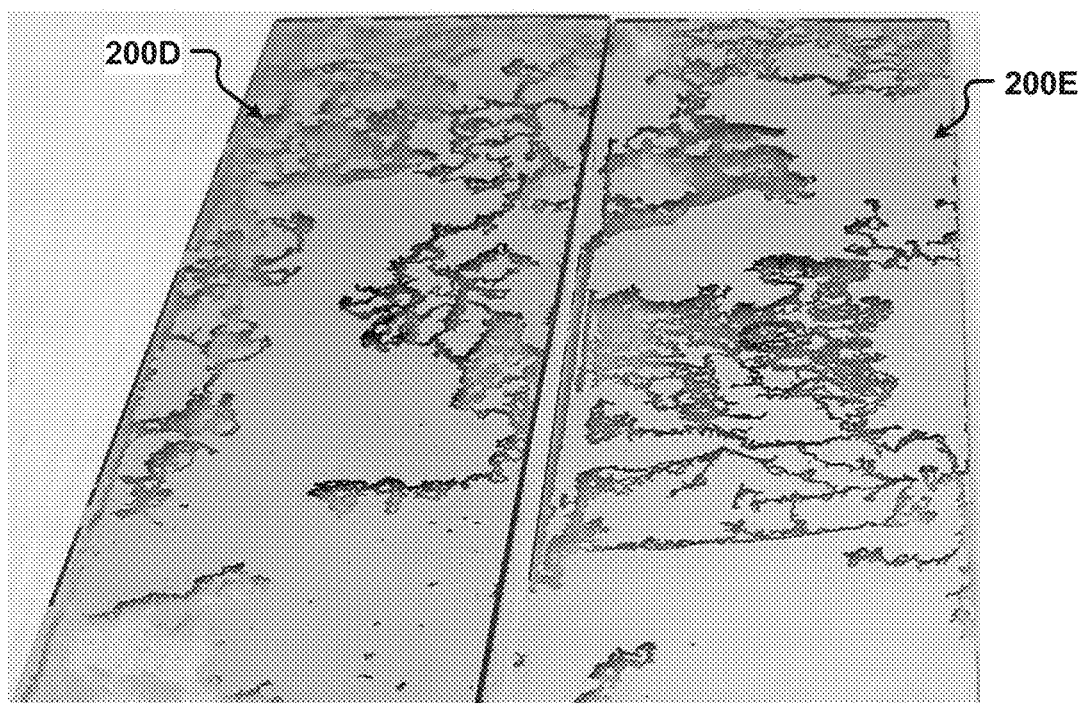
FIGS. 13A and 13B are photographs of two conventional mirrors and two mirrors having an energetically bonded O/H coating according to embodiments of the present disclosure, respectively, after salt spray testing.
Figure 13B:
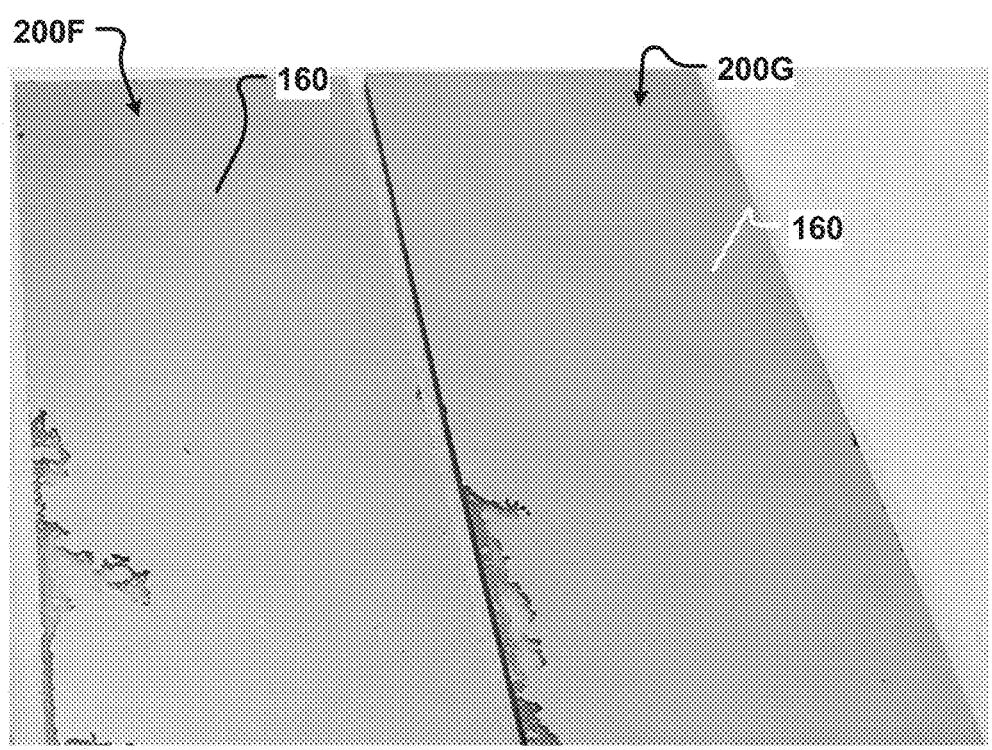

Referring now to FIGS. 13A and 13B, the results of the salt spray testing are illustrated. As is readily apparent, non-O/H-treated sample mirrors 200D,E (FIG. 13A) showed significant degradation across about 60-70% of the mirror surface, whereas O/H-treated sample mirrors 200F,G (FIG. 13B) showed degradation across only about 5-10% of the mirror surface. In those areas of the O/H-treated mirrors 200F,G with no visible degradation, the surface of the mirror remained in pristine condition.

It was also observed that any degradation present on the O/H-treated sample mirrors 200F,G appears only at the edges of the mirrors. The mirrors 200F,G used for this Example were made from "snap-cut" microscope slides without beveled edges, and, without wishing to be bound by any particular theory, it is thus hypothesized that fissures and microscopic cracks on the edges of the samples 200F,G may allow infiltration of saltwater, and that mirrors made with beveled edges and/or treated to minimize edge defects may provide further resilience against salt spray.

Example 9: Optical Performance Testing

The reflectivity of the sample mirrors 200A,B of Example 4 was tested across a wavelength range of 400 nm (violet) to 700 nm (red), i.e. across most of the visible spectrum, with an angle of incidence of 20% and the coatings of both mirrors 200A,B having approximately equal thickness. A graph of the reflectivity of each sample mirror across this range is provided as FIG. 14 with wavelength in nanometers on the x-axis and percent reflectivity on the y-axis.

Figure 14:
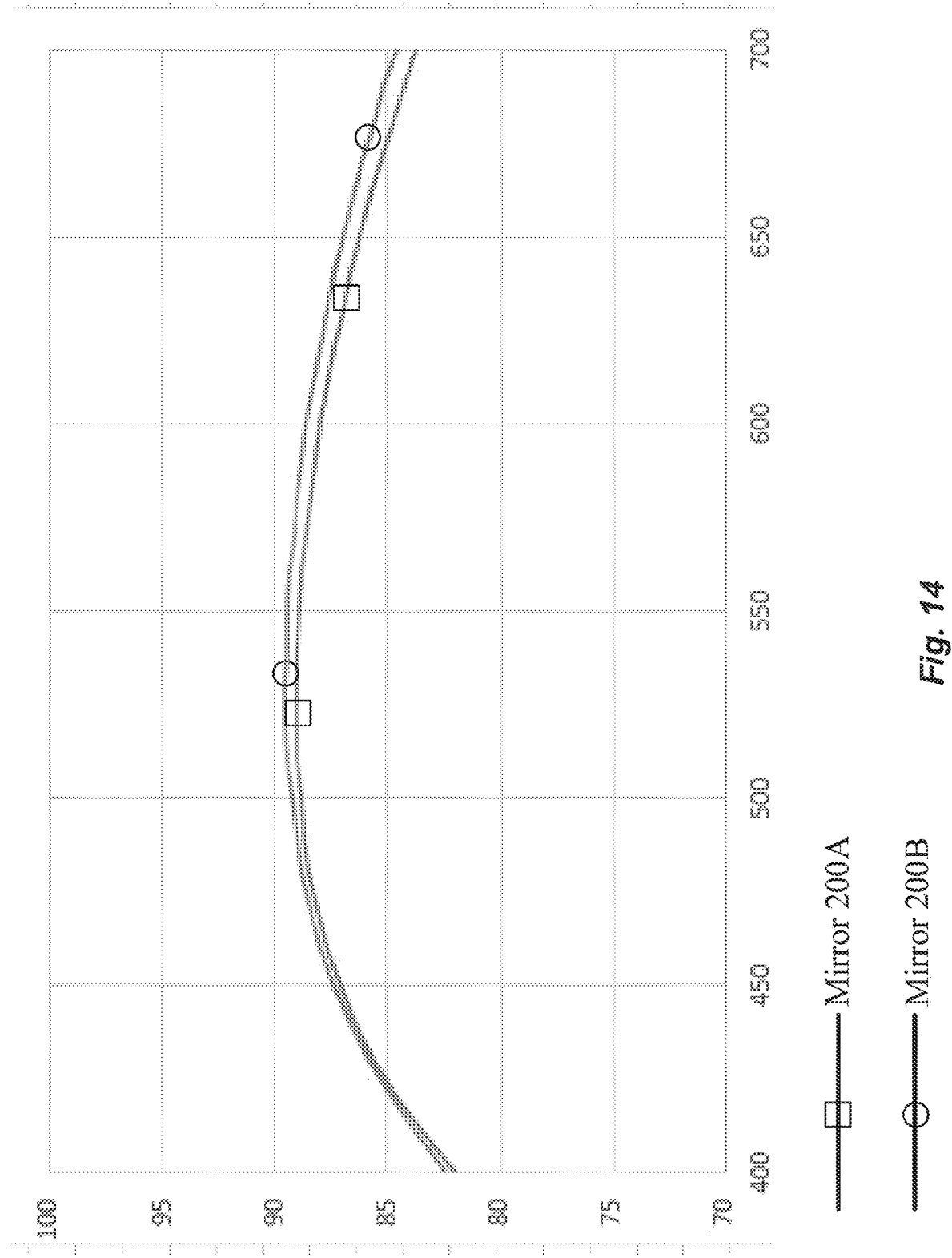
FIG. 14 is a graph of the reflectivity of a conventional mirror and a mirror having an energetically bonded O/H coating according to embodiments of the present disclosure.

As FIG. 14 illustrates, the application of the O/H layer 160 to mirror coatings has no readily discernible negative or detrimental effect on the optical performance of the mirror coating. In fact, the O/H-treated mirror 200B had slightly greater average reflectivity across the range of 450 to 650 nm (88.7%) than the non-O/H-treated sample mirror 200A (88.1%), although this difference was well within experimental error and is not believed to be indicative of a meaningful difference in performance. This result is expected, given that WR4-SF (the O/H coating material applied to the O/H-treated mirror 200B) is a low-absorbance material with a refractive index very similar to the material of the immediately underlying protective layer, i.e. silicon dioxide. Of course, it is expressly contemplated that in certain embodiments, it may be desirable to select an O/H coating material that modifies optical properties of the mirror to achieve a desired optical effect, and that such modifications are within the scope of the present disclosure.

Example 10: Manufacturing Cost

The additional time and cost of materials incurred in the manufacturing process of Example 1, relative to comparable manufacturing processes of conventional mirrors not having an O/H layer, were assessed. It was observed that the step of depositing the O/H top layer 160 generally takes about an additional 10 minutes, representing an addition of approximately 25% to conventional non-O/H methods that take about 40 minutes. The resistive tungsten boats holding the O/H "pills" or "tablets" have a cost of approximately $23 each. Four boats were required for the coating process of Example 1, and each boat is expected to last for a total of ten manufacturing runs. The per-run cost of the boats is thus $9.20. WR4-SF pills have a cost of approximately $23.83 each, and eight pills are entirely consumed during each manufacturing run. The per-run cost of the O/H material is thus $190.64, yielding a total added material cost for the O/H coating of $199.84.

Example 11: Manufacturing of O/H Coated Mirrors

Mirrors for testing the effectiveness of O/H coatings of the present disclosure were formed by vacuum deposition, and specifically by depositing a 700-angstrom layer of aluminum via high-rate, non-IAD vacuum deposition on a glass substrate, followed by argon IAD of a 1650-angstrom layer of silicon dioxide atop the aluminum layer. Immediately after deposition of the final silicon dioxide layer and without venting the deposition chamber, an argon ion cleaning step 450, in which the mirror was further bombarded with argon ions without the introduction of any condensing film material was performed as described in conjunction with FIG. 4. The argon ion cleaning step was carried out for about 15 minutes to remove contaminants and improve the uniformity of the mirror surface (i.e. to "smoothen," or decrease the roughness of, the mirror surface) prior to application of the O/H coating.

Immediately after the argon ion cleaning step, and still without venting the deposition chamber, two tungsten boats (RD Mathis Company, Signal Hill, Calif.) were placed in the resistive source of the S36 coating chamber. Two "pills" or "tablets" of an O/H coating material, specifically Surfclear 300 (Canon Optron, Inc., Yuki, Japan), were then added to each boat. The O/H material was then deposited atop the final silicon dioxide layer 140 via vacuum deposition to form the finished optical-quality mirror having an energetically bonded O/H coating.

The coating of the finished mirror included (in ascending order from the substrate 110) a binder layer 120 of aluminum metal having a thickness of about 250 angstroms (applied at low deposition rate), a reflective layer 130 of aluminum metal having a thickness of about 700 angstroms (applied at high deposition rate), an IAD-deposited first protective layer 140 of silicon dioxide having a thickness of about 1350 angstroms, a non-IAD-deposited second protective layer 150 of silicon dioxide having a thickness of about 300 angstroms, and an O/H top layer 160 of Surfclear 300 having a thickness of about 150 angstroms.

The following Examples 12-18 illustrate comparisons between O/H coated mirrors prepared according to this Example 11 and mirrors having a conventional protective coating (i.e. lacking the O/H layer).

Example 12: Abrasion Testing and Qualitative Tactile Evaluation

A mirror produced according to Example 11 and a conventional mirror lacking the O/H layer were subjected to hardness testing according to paragraph 4.4.5 of United States Military Specification MIL-M-13508C, "Mirror, Front Surface Aluminized: For Optical Elements." In this test, a 1-pound test device with a ⅜"-thick pad of cheesecloth was rubbed against the coated surfaces for 50 passes. Both mirrors met the hardness specification of this test, and neither coating exhibited any sign of damage after the test.

Both mirrors were then subjected to the severe abrasion test of paragraph 4.5.10 of United States Military Specification MIL-C-675C, "Coating of Glass Optical Elements (Anti-Reflection)." In this more aggressive test, which is generally not used to evaluate metallic coatings but reserved for dielectric coatings, a 2.0-pound test device with an eraser end was rubbed against the coated surfaces for 40 passes. While both mirrors failed this more aggressive test, both performed well by the standards of metallic-coated mirrors.

After the abrasion testing, both mirrors were qualitatively evaluated for tactile characteristics. It was observed that the mirror including the O/H layer felt noticeably "slicker" to the touch than the conventional mirror. Without wishing to be bound by any particular theory, it is believed that this increased "slickness" can cause a potentially abrasive material to be deflected away from the mirror surface more easily, thereby protecting the mirror and O/H coating 160 against scratching.

Example 13: Adhesion Testing

Several conventional mirrors lacking both an O/H layer and an IAD-deposited binder layer were subjected to "tape pull" adherence testing according to MIL-M-13508C, ¶ 4.4.6. In this test, a piece of cellophane tape (Scotch 600) was pressed against the surface and then slowly removed at a 90° angle. Some conventional mirrors passed this test, while others failed. By contrast, several mirrors having an IAD-deposited binder layer (but no O/H layer) were tested according to the same procedure; all of these mirrors passed.

The mirrors having the IAD-deposited binder layer but no O/H layer were then subjected to "tape pull" adhesion testing according to MIL-C-675C, ¶ 4.5.12. In this more aggressive test, which is generally not used to evaluate metallic coatings but reserved for dielectric coatings, a piece of cellophane tape was pressed against the surface and then quickly "snapped" off of the coating. All of the tested mirrors passed. The same test protocol was repeated on the same samples using duct tape, gaffer's tape, electrical tape, packing tape, and Kapton tape in place of the cellophane tape, with the same result—none of the tapes caused removal of the coating from the glass substrate of the mirror.

Figure 15B:
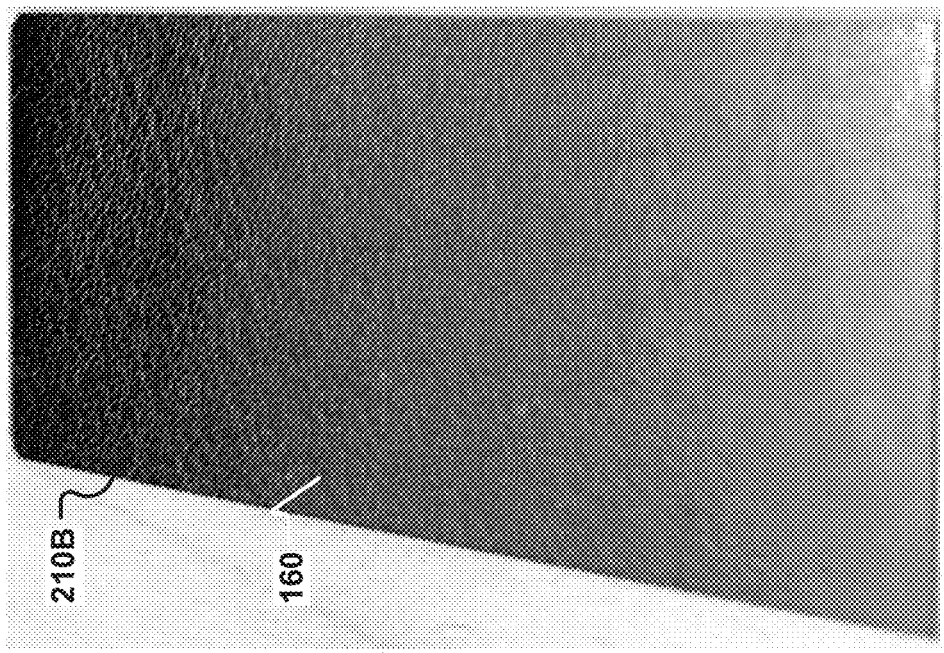
FIGS. 15A and 15B are photographs of a conventional mirror and a mirror having an energetically bonded O/H coating according to embodiments of the present disclosure, respectively, after a "tape pull" adhesion test.
Figure 15A:
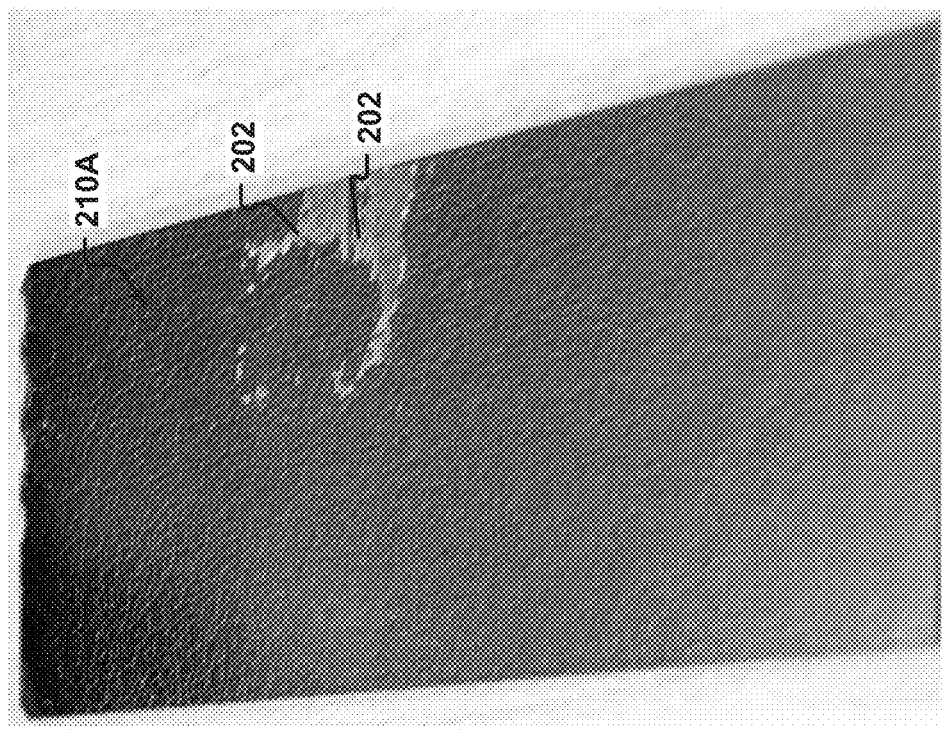

Referring now to FIGS. 15A and 15B, a mirror 210A having the IAD-deposited binder layer 120 but no O/H layer (FIG. 15A) and a mirror 210B produced according to Example 11 (FIG. 15B) were subjected to the tape pull adhesion test of MIL-C-675C, ¶ 4.5.12. While both mirrors 210A,B passed the test, FIG. 15A clearly illustrates a "tacky" residue 202 left behind on the surface of the non-O/H-coated mirror 210A, which required wiping with alcohol to be removed.

By contrast, as FIG. 15B illustrates, the O/H-treated mirror 210B shows no residue left behind by the tape and required no cleaning after the test. It was further observed that the tape could be removed from the O/H-treated mirror 210B with very little effort. This Example thus illustrates that addition of the O/H layer to the mirrors 10, 210B of the present disclosure improves the adhesion performance of optical-quality mirrors by rejecting external adhesive forces.

Example 14: Hydrophobicity Testing

The sample mirrors 210A,B illustrated in FIGS. 15A and 15B were subjected to water bead testing to evaluate their relative hydrophobicity qualities. Specifically, a droplet of water 204 was delivered to the surface of both mirrors 210A,B via pipet. The droplets applied to both mirrors were of approximately equal volume.

Figure 16A:
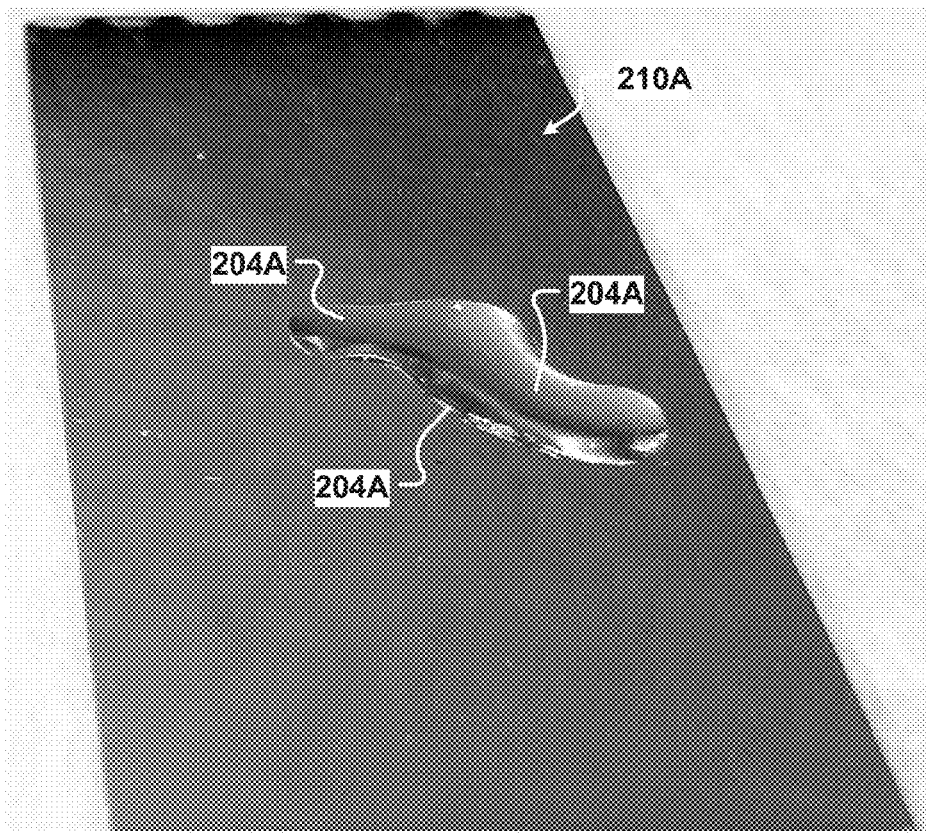
FIGS. 16A and 16B are photographs of a conventional mirror and a mirror having an energetically bonded O/H coating according to embodiments of the present disclosure, respectively, with droplets of water applied to the surfaces thereof.
Figure 17A:
FIGS. 17A and 17B are closeup views of the mirrors of FIGS. 16A and 16B, respectively, with droplets of water applied to the surfaces thereof.
Figure 16B:
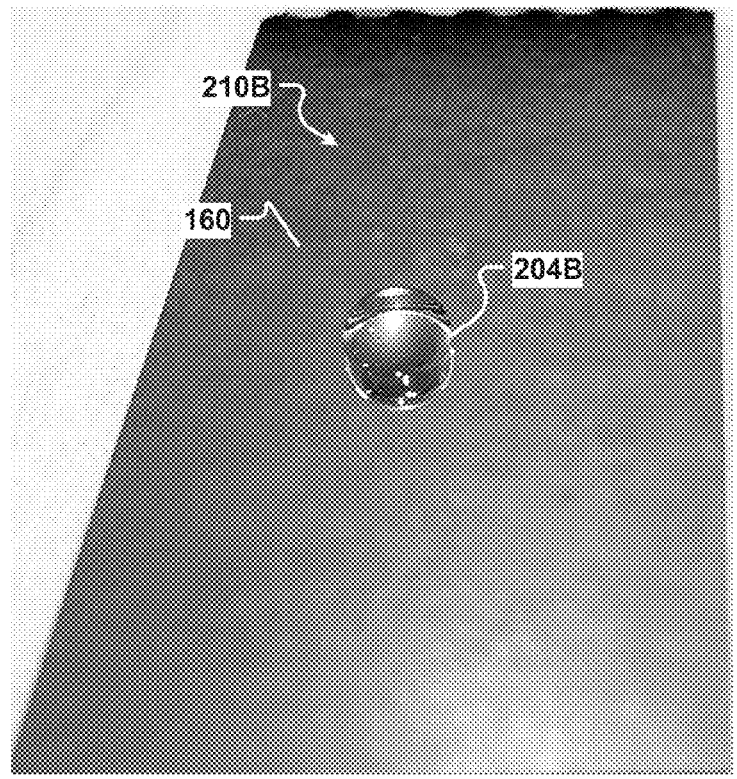
Figure 17B:
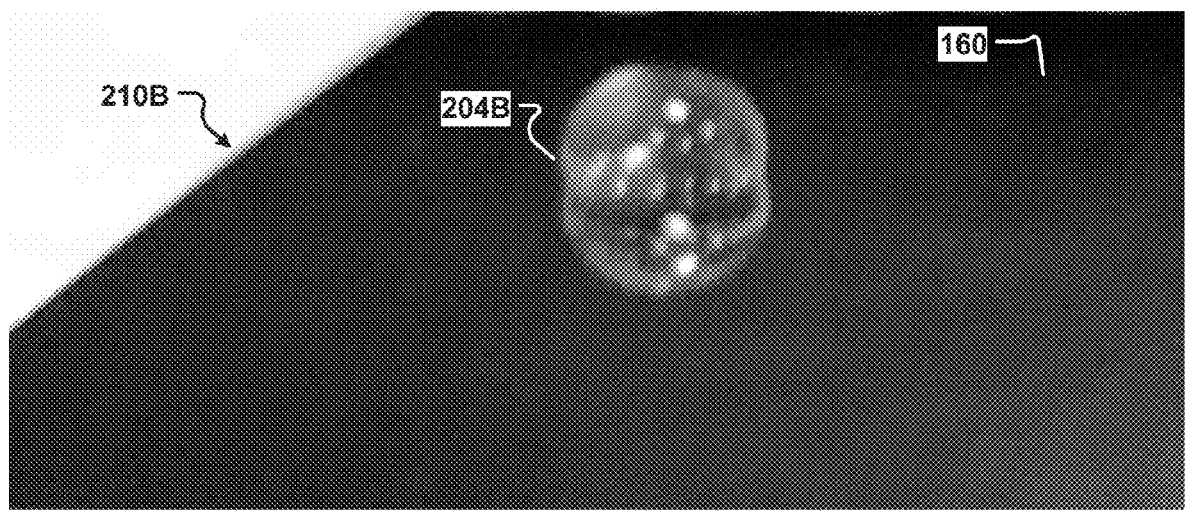

Referring now to FIGS. 16A through 17B, the conformation of the water droplets 204 after application to both sample mirrors 210A,B is illustrated. It is readily apparent that whereas the droplet 204A applied to the mirror 210A having no O/H layer (FIGS. 16A and 17A) lay flat and conformed closely to the surface of the mirror 210A, the increased hydrophobicity of the O/H-treated mirror 210B (FIGS. 16B and 17B) results in the formation of a bead 204B that much more closely approximates a spherical conformation. As best illustrated in FIG. 17B, the contact angle between the water bead 204B and the surface of the O/H-treated mirror 210B is greater than 90°—that is, rather than resting perpendicular to the surface of the mirror 210B (e.g. in a hemispherical conformation), the bead actually curves back under itself. This result is in accordance with the assertion by the manufacturer of the Surfclear 300 material that it can achieve a water contact angle of 115°.

As illustrated in FIGS. 16A and 17A, the water contact angle of uncoated glasses and glasses having non-hydrophobic coatings (e.g. non-O/H-treated mirrors 210A) is generally about 40°. As a result, whereas water can simply be shaken off of the O/H-treated mirror 210B, the non-O/H-treated mirror 210A had to be wiped or dried to remove the water from the surface.

The two sample mirrors 210A,B were then tested to evaluate the "sliding angle," i.e. the angle at which a bead of water will begin to "slide" (i.e. flow) off the sample when the sample is tilted. For the non-O/H-treated mirror 210A (FIGS. 16A and 17A), the sliding angle was approximately 85°, meaning that the sample mirror 210A had to be held nearly vertically for flow to begin, and even under this condition the flow was slow and residual water remained on the surface and had to be wiped away.

By contrast, the sliding angle of the O/H-treated mirror 210B (FIGS. 16B and 17B) was only about 14°, and even at low angles the water flowed quickly and completely off the mirror 210B, leaving the mirror 210B dry without the need to wipe away residual water. The hydrophobic phenomenon illustrated in FIGS. 16B and 17B may thus be particularly useful to improve the resilience of mirrors 10, 210B of the present disclosure against large-scale wetting events, as most or perhaps even all of any large quantity of water will simply flow or fall away from the hydrophobic surface of the mirror in sheets.

Example 15: Fingerprint Adherence and Removal Testing

A human tester applied both thumbs, which had been rubbed together in an attempt to distribute skin oils equally, to the surfaces of both sample mirrors 210A,B of Example 14 and applied approximately equal pressure for approximately equal times.

Figure 18A:
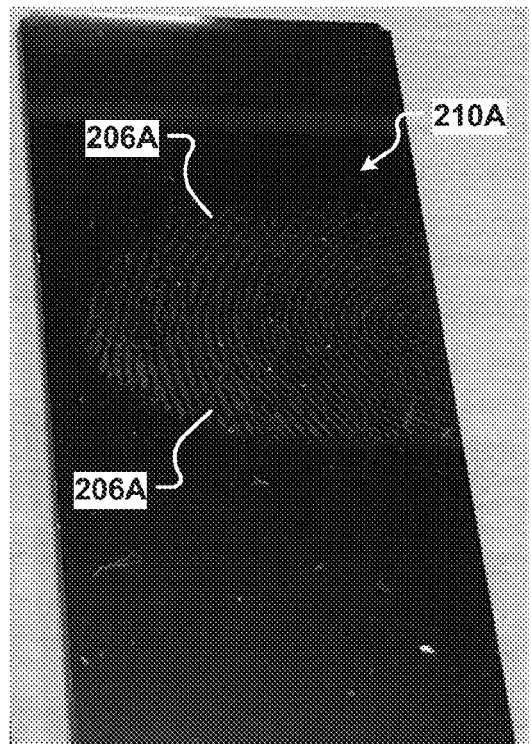
FIGS. 18A and 18B are photographs of a conventional mirror and a mirror having an energetically bonded O/H coating according to embodiments of the present disclosure, respectively, with fingerprints applied to the surfaces thereof.
Figure 18B:
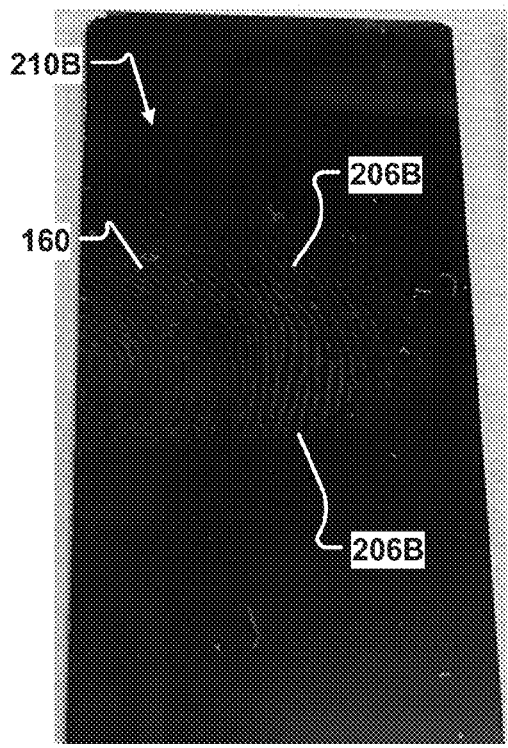

Referring now to FIGS. 18A and 18B, the fingerprints 206 left due to the application of the tester's thumbs on both sample mirrors 210A, 210B are illustrated. Although the effect is not as striking as the result of the water bead testing of Example 14, the fingerprint 206B left on the O/H-treated mirror 210B (FIG. 18B) is noticeably less pronounced than the fingerprint 206A left on the non-O/H-treated mirror 210A (FIG. 18A), consistent with the O/H material manufacturer's claims of an oil contact angle of about 70°.

Figure 19A:
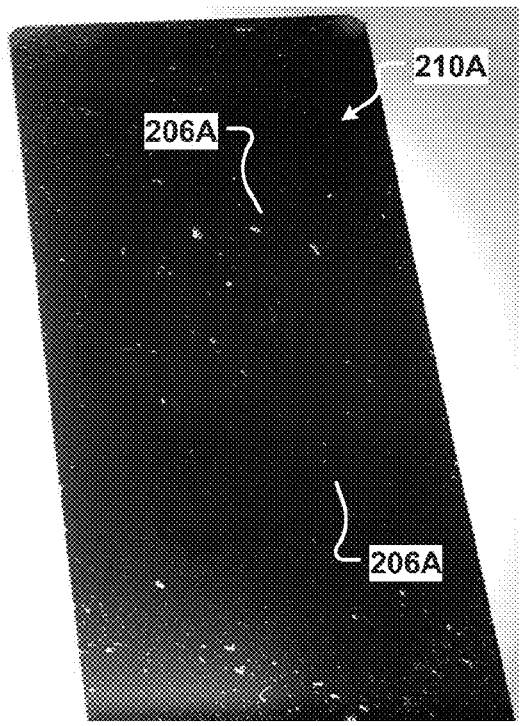
FIGS. 19A and 19B are photographs of the mirrors of FIGS. 18A and 18B, respectively, after rubbing the mirrors with a dry paper towel.
Figure 19B:
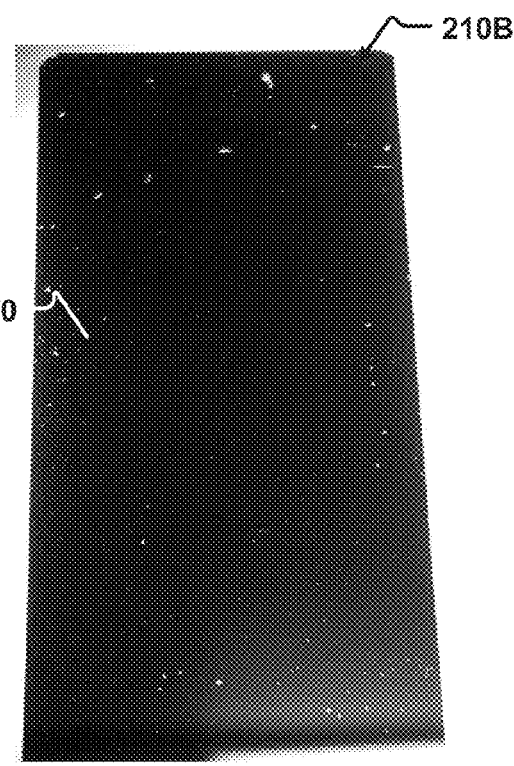

Referring now to FIGS. 19A and 19B, both sample mirrors 210A,B were rubbed with a dry paper towel to attempt to remove the fingerprints 206 from the mirror surfaces. As is clearly seen, the fingerprint is much more completely removed from the O/H-treated mirror 210B (FIG. 19B) than from the non-O/H-treated mirror 210A (FIG. 19B). Particularly, the non-O/H-treated mirror 210A is left with a hazy bluish residue, which required the application of a foaming spray cleaner to be completely removed. In contract, the O/H-treated mirror 210B did not have any residue and did not require the application of any type of cleaner as shown in FIG. 19B.

Example 16: Permanent Ink Removal Testing

Figure 20A:
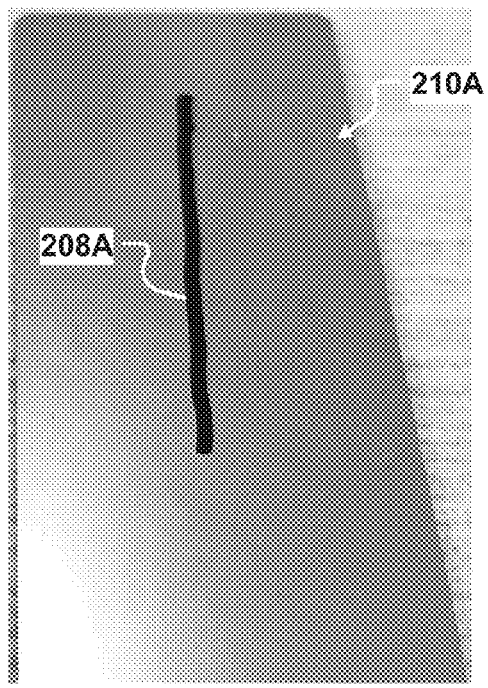
FIGS. 20A and 20B are photographs of a conventional mirror and a mirror having an energetically bonded O/H coating according to embodiments of the present disclosure, respectively, with permanent ink applied to the surfaces thereof.
Figure 20B:
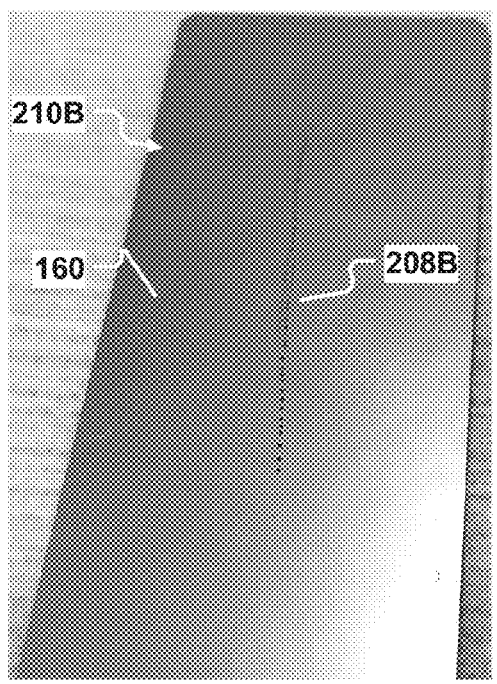

Referring now to FIGS. 20A and 20B, a Fine-tip Sharpie® permanent marker (Newell Brands, Atlanta, Ga.) was used to mark the surfaces of both sample mirrors 210A,B of Example 14. It is readily apparent that the mirror 210A having no O/H layer (FIG. 20A) receives the permanent ink 208A as readily as paper or untreated glass. In contrast, the increased hydrophobicity and/or oleophobicity of the O/H-treated mirror 210B (FIG. 20B) causes the surface of the mirror 210B to reject the ink 208B and cause the ink to bead on the surface, resulting in a much fainter, lighter mark.

Figure 21A:
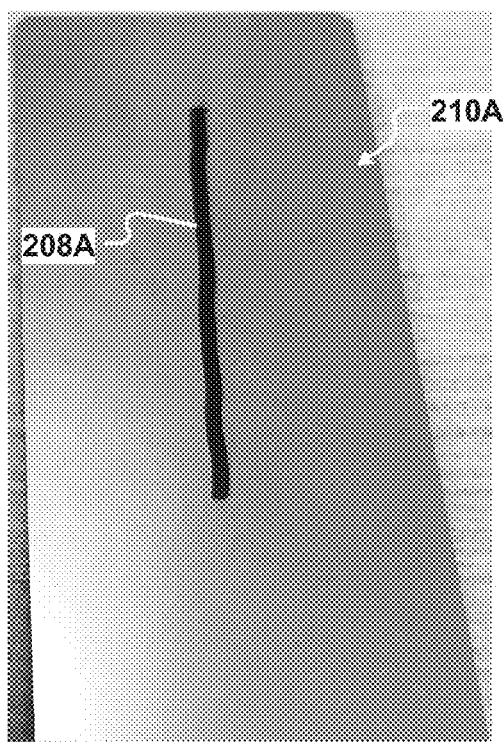
FIGS. 21A and 21B are photographs of the mirrors of FIGS. 20A and 20B, respectively, after rubbing the mirrors with a dry paper towel.
Figure 21B:
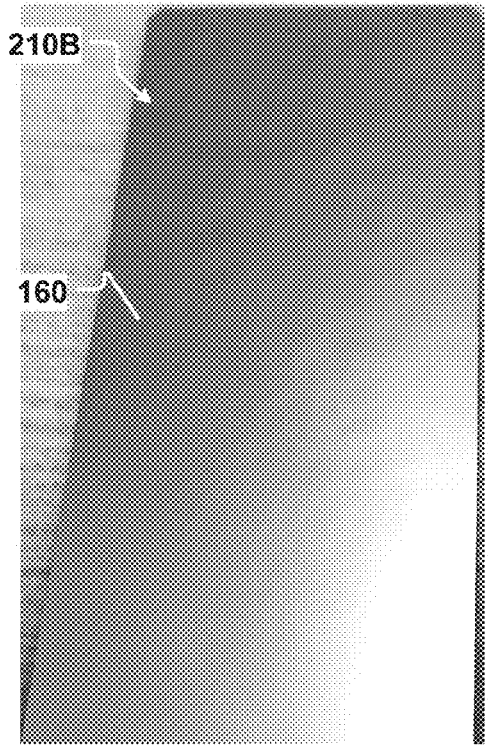

Referring now to FIGS. 21A and 21B, both sample mirrors 210A,B were rubbed with a dry paper towel to attempt to remove the permanent ink 208 from their surfaces. As is clearly seen, the permanent ink 208A deposited on the mirror 210A having no O/H layer (FIG. 21A) is largely unaffected, and it was possible to remove the ink only with the use of foaming spray cleaner or other similar solvent. The permanent ink was fully removed, however, from the O/H-treated mirror 210B by this dry rub with a paper towel as shown in FIG. 21B. Upon repeating this test on the O/H-treated sample 210B, it was observed that it was generally easiest to remove the permanent ink from the O/H-treated sample 210B within a short time after application of the ink, as the beaded permanent ink had not yet dried and so could be removed with a dry paper towel with little or no pressure. Removal of the permanent ink after drying required the application of some pressure, but could still be achieved by a dry paper towel without the use of a cleaner or other solvent.

Example 17: Uniformity of O/H coating application

To test the uniformity of the application of the O/H coating to a mirror with a radius of curvature of about 9.25 feet, sample mirrors 210C-1, 210C-2, 210C-3, 210C-4, 210C-5, 210C-6, 210C-7 were spaced along the surface of a surrogate substrate with a radius of curvature of about 9.25 feet and produced according to Example 11. The sample mirrors 210C-1-210C-7 were positioned at intervals along a radius of the surrogate substrate, starting at the center of the surrogate substrate and then spaced approximately every 10 inches along the radius during production. The sample mirrors 210C-1-210C-7 where then marked with the same marker used in Example 16. Because the surrogate and the substrate rotate about the center of the substrate while in the deposition chamber during the coating process, these radial points are representative of concentric circles of the front portion 14 of mirror 10.

Figure 22:
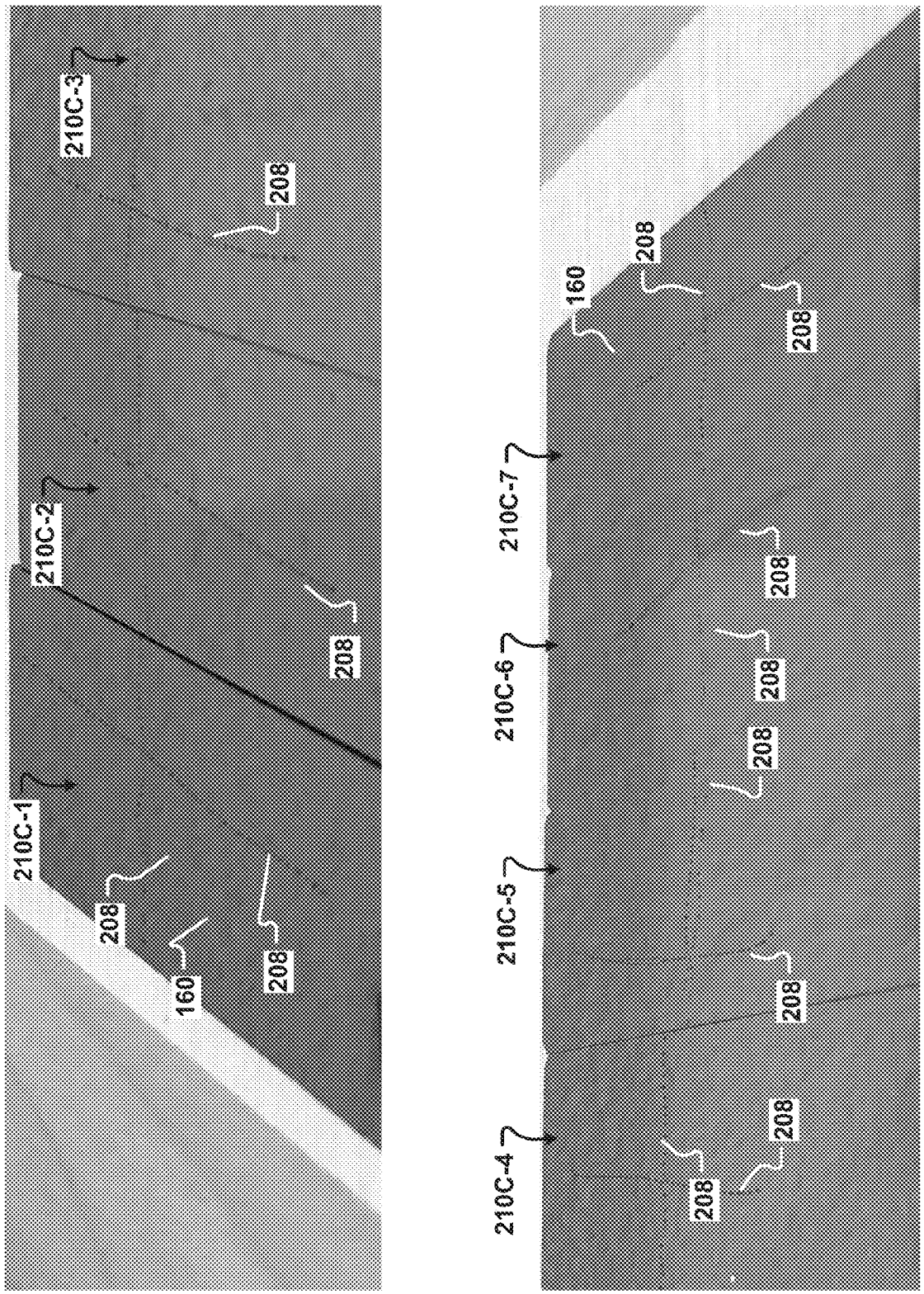
FIG. 22 are photographs of seven sample mirrors that each have an energetically bonded O/H coating according to embodiments of the present disclosure.

Referring now to FIG. 22, the effect of the ink 208 from the permanent marker is shown to be consistent on each of the sample mirrors 210C-1-210C-7 that were positioned along the radial length of the surrogate substrate. This indicates that the effectiveness of the O/H coating is effectively uniform across the entire width of the substrate.

Example 18: Foaming Spray Cleaner Testing

An O/H-treated mirror made according to the procedure of Example 11, having a radius of curvature of 11 feet, was subjected to a cleaning procedure in which a foaming spray glass cleaner was applied to the entire surface of the mirror and then wiped off with a dry microfiber mop head as soon as the cleaner foam began to slide down the surface of the mirror. No additional pressure was applied to the mop head. This process was continued until the foaming spray glass cleaner was removed from the entire surface of the mirror. The results were identical to those described in Example 7.

Example 19: Optical Performance Testing

The reflectivity of the sample mirrors 210A, 210B of Example 14 were tested across a wavelength range of 400 nm (violet) to 700 nm (red), i.e. across most of the visible spectrum, with an angle of incidence of 20% and the coatings of both mirrors having approximately equal thickness. A graph of the reflectivity of each mirror 210A, 210B across this range is provided as FIG. 23 (wavelength in nanometers is on the x-axis, percent reflectivity is on the y-axis).

Figure 23:
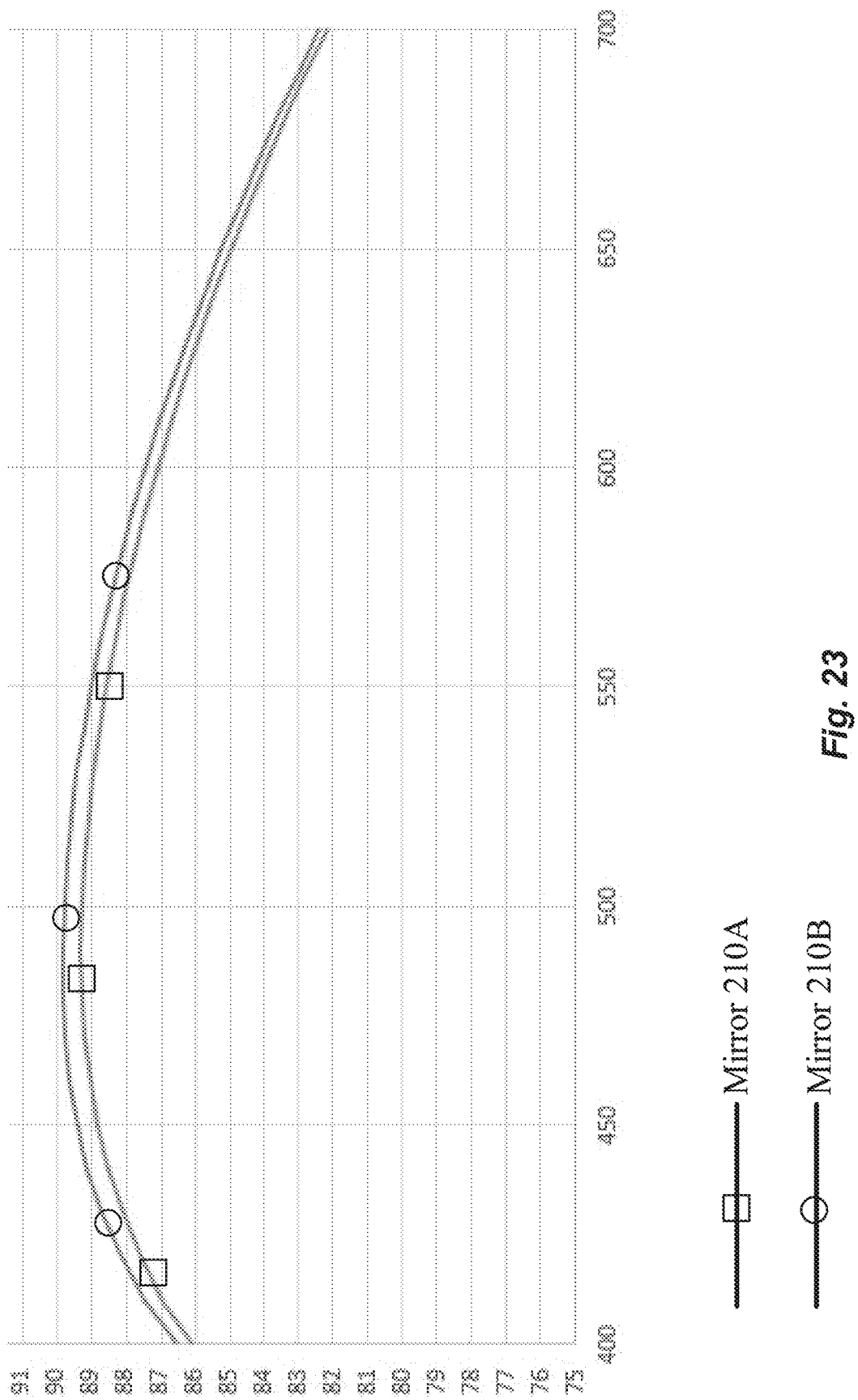
FIG. 23 is a graph of the reflectivity of a conventional mirror and a mirror having an energetically bonded O/H coating according to embodiments of the present disclosure.

As FIG. 23 illustrates, the application of the O/H layer 160 to mirror coatings has no readily discernible negative or detrimental effect on the optical performance of the mirror coating. This result is expected, given that Surfclear 300 (the O/H coating material applied to the O/H-treated mirror 210B) is a low-absorbance material with a refractive index very similar to the material of the immediately underlying protective layer, i.e. silicon dioxide of the protective layer 140. Of course, it is expressly contemplated that in certain embodiments, it may be desirable to select an O/H coating material that modifies optical properties of the mirror to achieve a desired optical effect, and that such modifications are within the scope of the present disclosure.

Figure 24A:
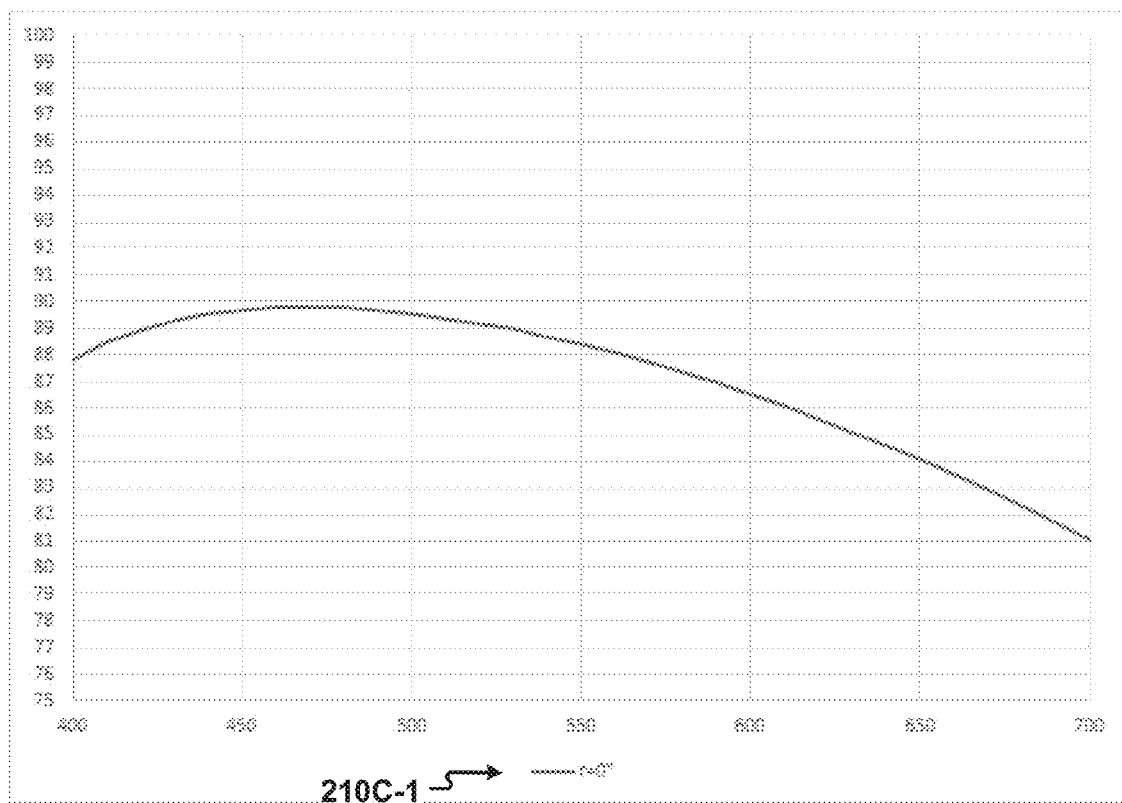
FIGS. 24A, 24B, 24C, 24D, 24E, 24F, and 24G are a graphs of the reflectivity of the sample mirrors having an energetically bonded O/H coating of FIG. 22.
Figure 24B:
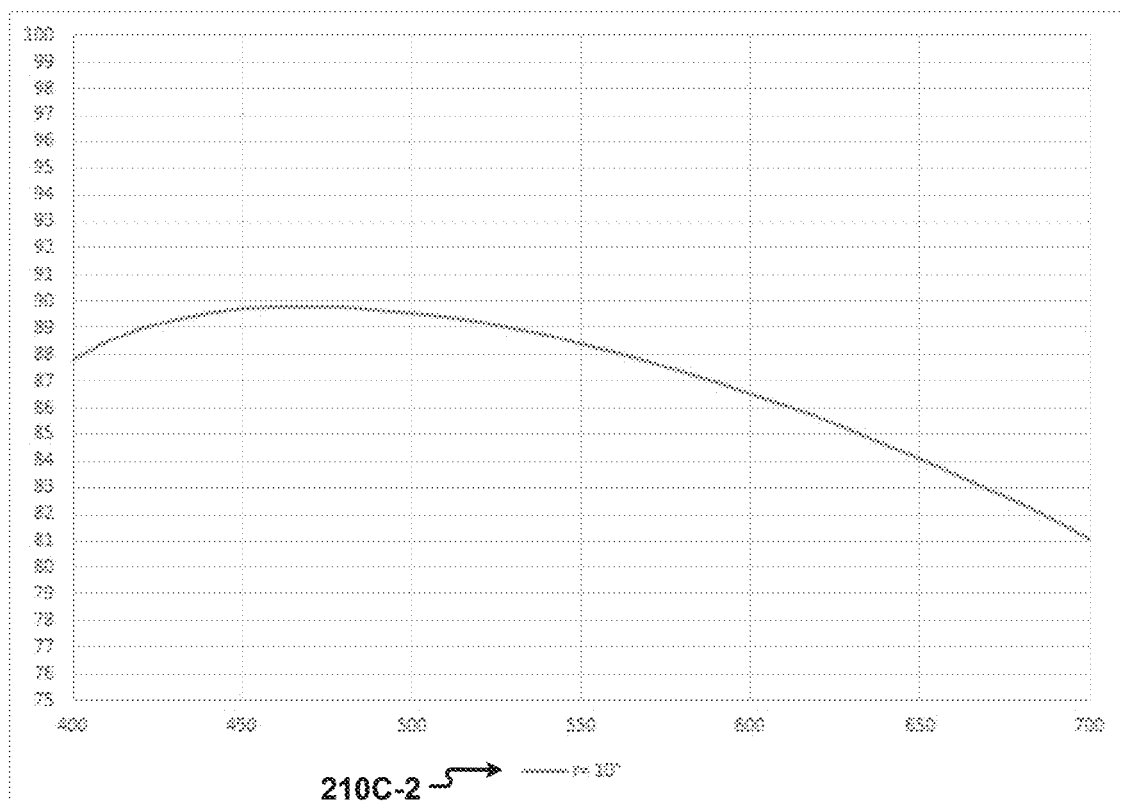
Figure 24C:
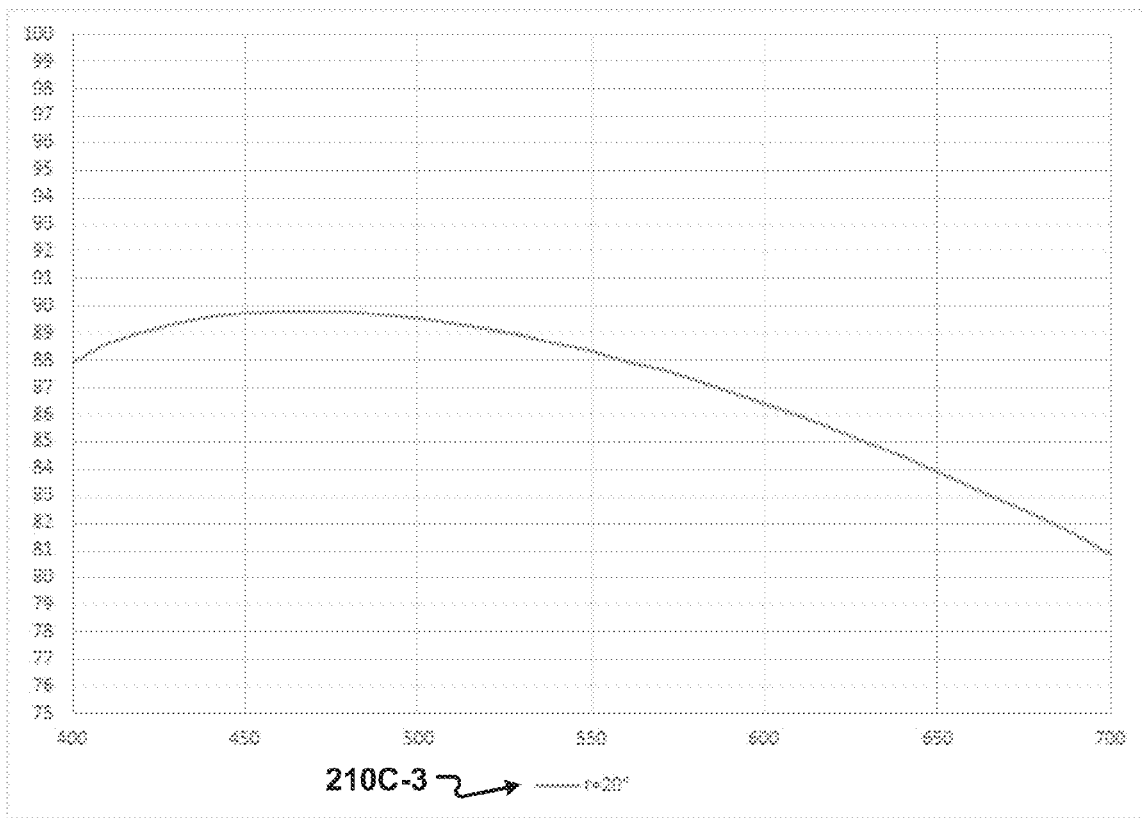
Figure 24D:
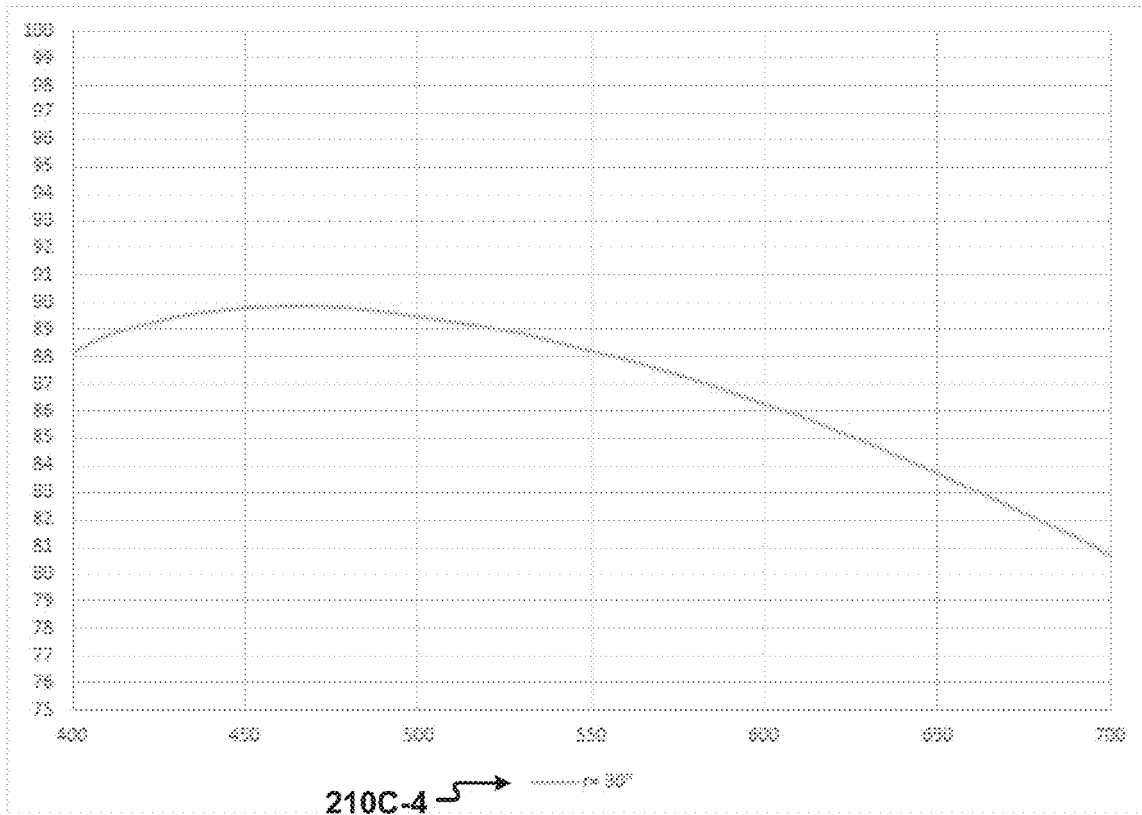
Figure 24E:
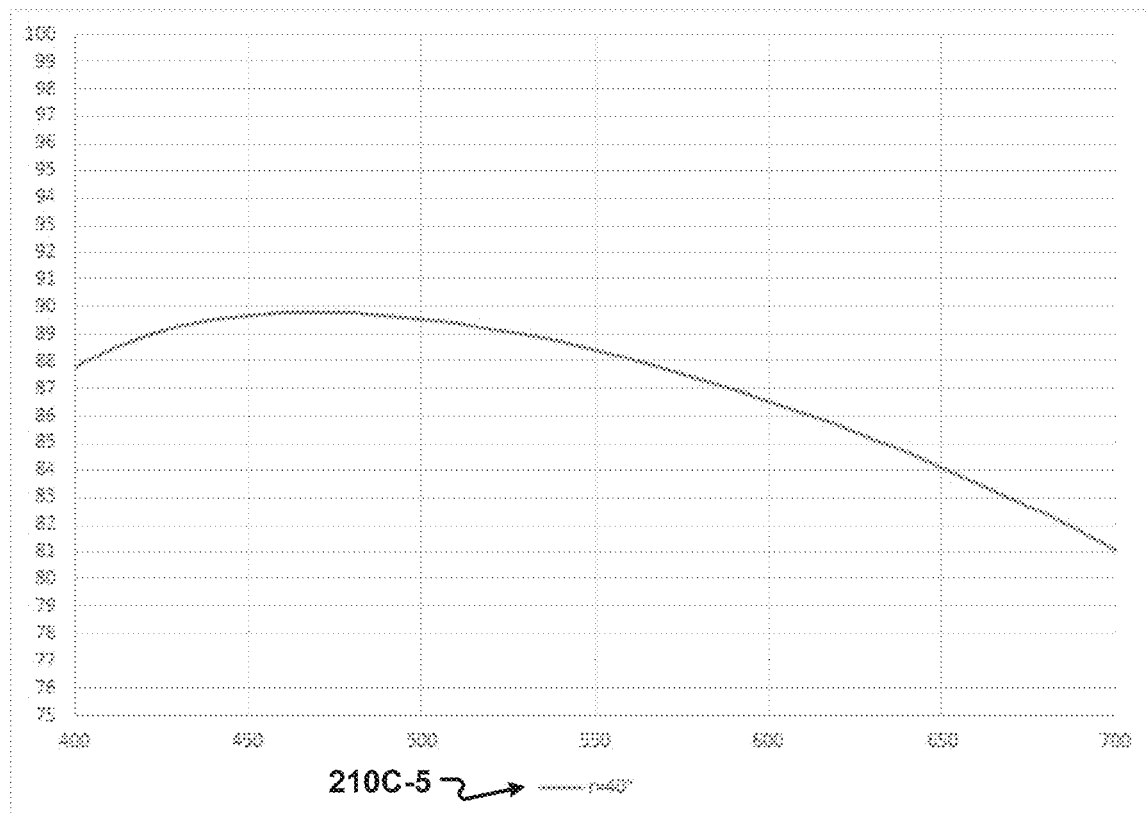
Figure 24F:
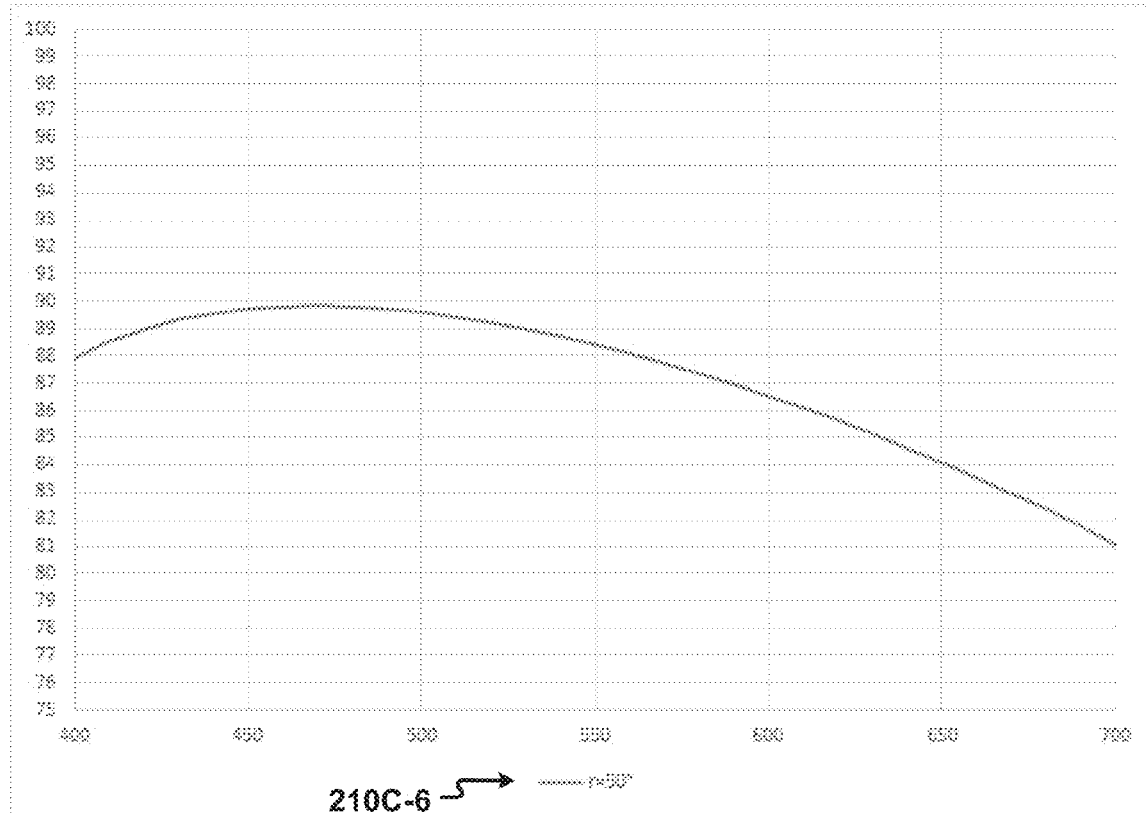
Figure 24G:
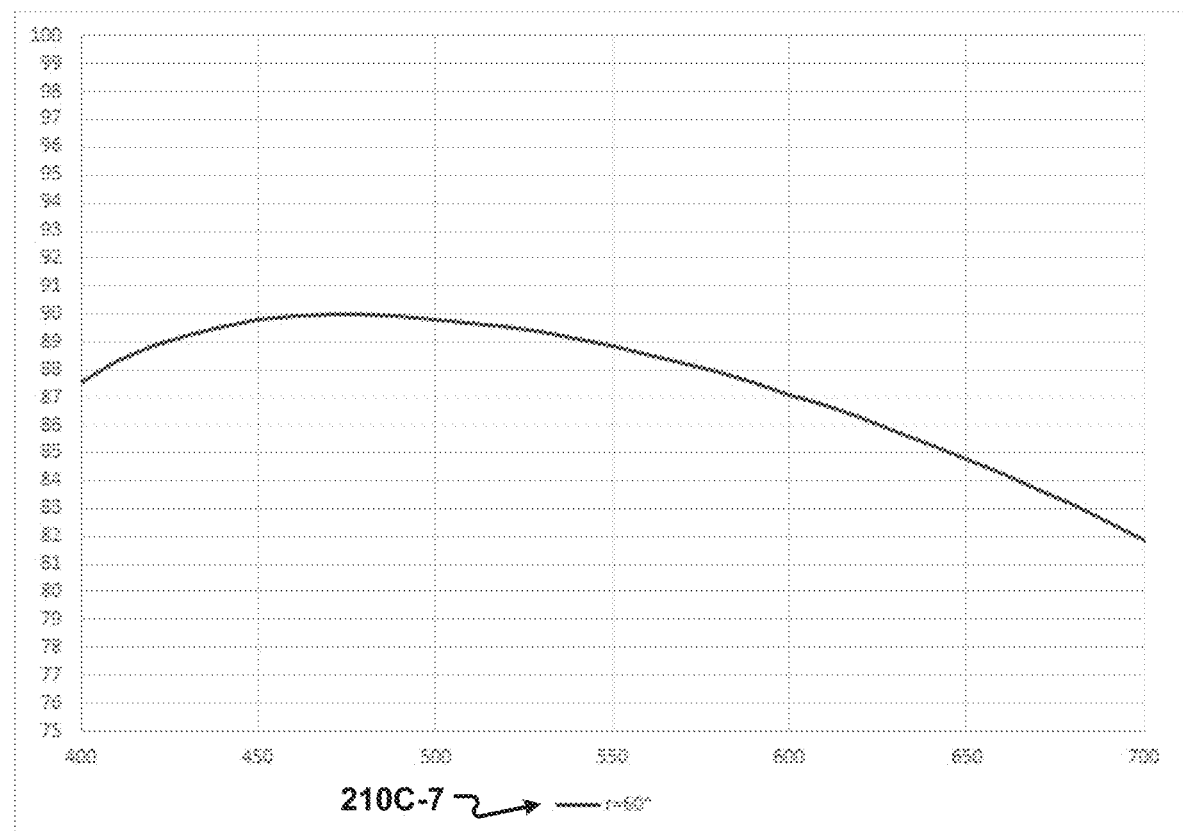

To test the optical uniformity of the O/H coating 160, this test was repeated using the seven sample mirrors 210C-1-210C-7 produced as described in Example 17. Referring now to FIGS. 24A-24G, the reflectivity of the mirrors 210C-1-210C-7 at each radial point is graphed as a separate curve (seven graphs in total) with wavelength in nanometers on the x-axis and percent reflectivity on the y-axis. More specifically, FIG. 24A illustrates the reflectivity of the mirror 210C-1 which was formed while positioned at the center (or r=0") of the surrogate substrate. FIG. 24B illustrates the reflectivity of the mirror 210C-2 formed at a position approximately 10" from the center (or r=10") of the surrogate substrate. FIG. 24C illustrates the reflectivity of the mirror 210C-3 which was positioned at approximately 20" from the center (or r=20") of the surrogate substrate. FIG. 24D is a graph of the reflectivity of the mirror 210C-4 positioned formed at a position approximately 30" from the center (or r=30") of the surrogate substrate. FIG. 24E illustrates the reflectivity of the mirror 210C-5 which was positioned at approximately 40" from the center (or r=40") of the surrogate substrate when formed. FIG. 24F is a graph of the reflectivity of the mirror 210C-6 positioned at approximately 50" from the center (or r=50") of the surrogate substrate. FIG. 24G shows the reflectivity of the mirror 210C-7 positioned at approximately 60" from the center (or r=60") of the surrogate substrate. The optical performance is shown to be broadly consistent for mirrors formed at all points across the radial length of the surrogate substrate, with only very minor variations in reflectivity as a function of radial distance.

Example 20: Coating Thickness Uniformity

To determine the thickness of the O/H coating 160 at each of the seven radial points represented by the sample mirrors 210C-1-210C-7 of Example 17, the peak reflectivity value for each curve shown in FIGS. 24A-24G was determined, and the reflectivity value at each of these peaks was then compared to the average reflectivity value of all seven peaks. This method produces a "normalized thickness" value that describes the uniformity of the coating.

Figure 25:
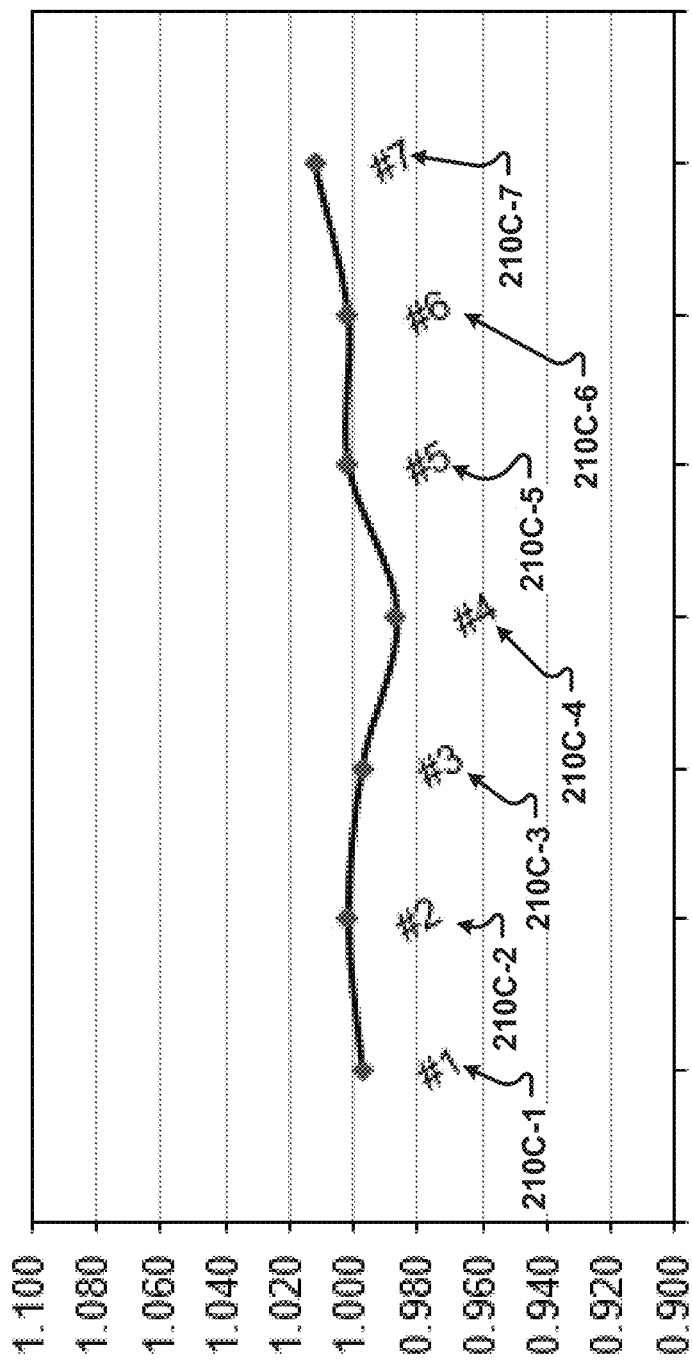
FIG. 25 is a graph of variations in thicknesses of coatings of the mirrors of FIG. 22.

Referring now to FIG. 25, the normalized thickness for all seven radial points is shown; "#1" represents the normalized thickness at a radius of 0" (the center of the surrogate substrate where sample mirror 210C-1 was positioned on the surrogate substrate within the deposition chamber) and "#7" represents the normalized thickness of sample mirror 210C-7 which was positioned at a radius of 60" on the surrogate substrate. As FIG. 25 shows, the largest variation from the average thickness coating (which in this case is normalized to 1.000) is at points #4 (mirror 210C-4) and #7 (mirror 210C-7), with normalized thicknesses of about 0.987 and about 1.013, respectively. In other words, at all measured points, the thickness of the coating was within about ±1.3% of the average coating thickness. This is well within the specification for many high-performance mirror applications of no more than ±5%, and comparable to mirrors with O/H coatings produced by previous methods.

Example 21: Manufacturing Cost

The additional time and cost of materials incurred in the manufacturing process of Example 11, relative to comparable manufacturing processes of conventional mirrors not having an O/H layer, were assessed. It was observed that the steps of performing an argon ion cleaning (operation 450 of method 400) and depositing the O/H top layer 160 (operation 460 of method 400) generally takes about an additional 20 minutes, representing an addition of approximately 50% to conventional non-O/H methods that take about 40 minutes. The resistive tungsten boats holding the O/H "pills" or "tablets" have a cost of approximately $12.47 each. Two boats were required for the coating process of Example 11, and each boat is expected to last for a total of three manufacturing runs. The per-run cost of the boats is thus $8.31. Surfclear 300 pills have a cost of approximately $48.25 each, and four pills are entirely consumed during each manufacturing run. The per-run cost of the O/H material is thus $193.00, yielding a total added material cost for the O/H coating of $201.31.

Example 22: O/H Coating of Damaged Mirror

Figure 27:
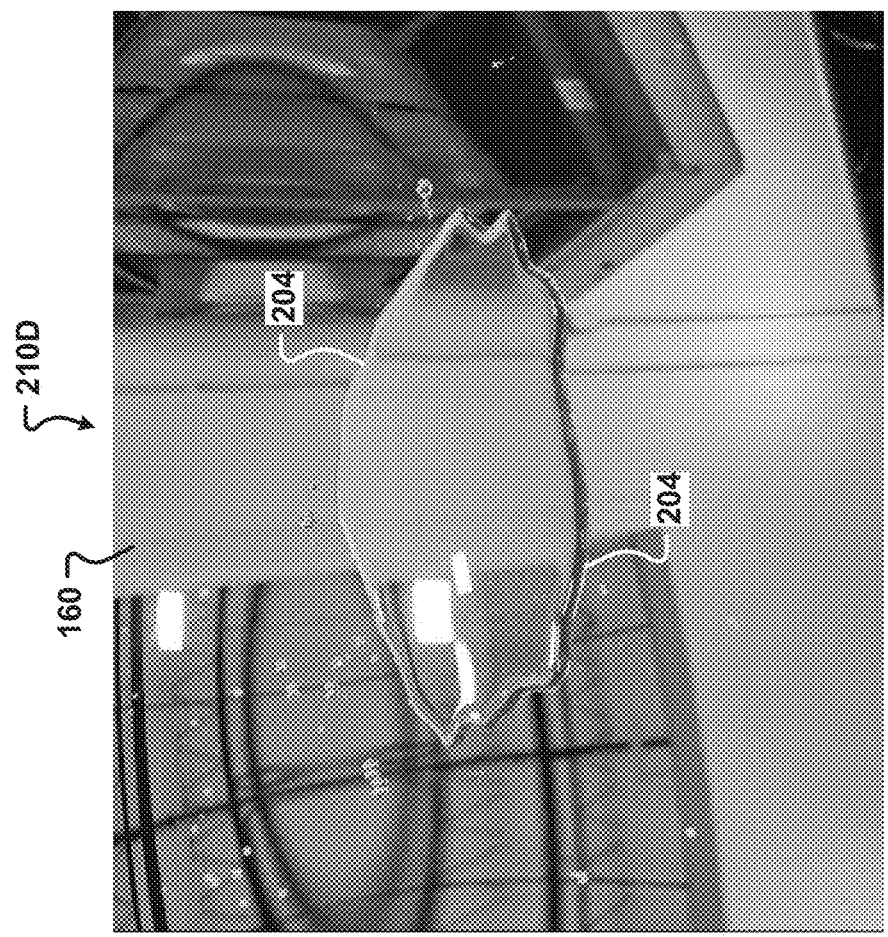
FIG. 27 is a photograph of another portion of the full-size conventional mirror of FIG. 26 with droplets of water applied to the surface thereof.
Figure 26:
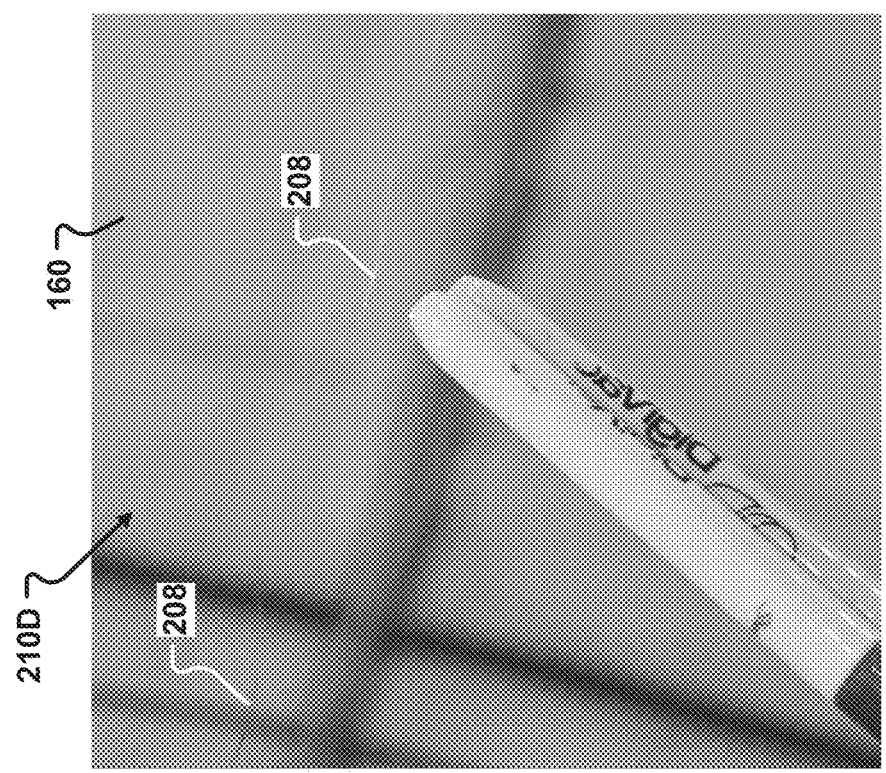
FIG. 26 is a photograph of a portion of a full-size conventional mirror to which an O/H coating has been applied according to embodiments of the present disclosure, with permanent ink applied to the surface thereof.

A conventional circular mirror 210D having a radius of curvature of 11 feet, which had been severely damaged during the grinding and polishing process and had large gouges in the uncoated mirror surface, was coated with an O/H layer 160 according to the method 400 of FIG. 4 as described in Example 11. This mirror 210D was then subjected to the tests described in Examples 12-16 and 18, with substantively identical results. FIG. 26 illustrates the results of the permanent ink test and illustrates ink 208 on the mirror 210D. FIG. 27 illustrates water 204 from the water application test on the mirror. The mirror 210D was then exposed to ambient indoor conditions for 52 days, with no visible degradation in O/H coating effectiveness or other negative effects.

The disclosure illustratively disclosed herein suitably may be practiced in the absence of any element which is not specifically disclosed herein. It is apparent to those skilled in the art, however, that many changes, variations, modifications, other uses, and applications of the disclosure are possible, and also changes, variations, modifications, other uses, and applications which do not depart from the spirit and scope of the disclosure are deemed to be covered by the disclosure, which is limited only by the claims which follow.

The foregoing discussion of the disclosure has been presented for purposes of illustration and description. The foregoing is not intended to limit the disclosure to the form or forms disclosed herein. In the foregoing Detailed Description, for example, various features of the disclosure are grouped together in one or more embodiments for the purpose of streamlining the disclosure. The features of the embodiments of the disclosure may be combined in alternate embodiments other than those discussed above. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as a separate preferred embodiment of the invention.

Moreover, though the description has included description of one or more embodiments and certain variations and modifications, other variations, combinations, and modifications are within the scope of the present disclosure, e.g. as may be within the skill and knowledge of those in the art, after understanding the present disclosure. It is intended to obtain rights which include alternative embodiments to the extent permitted, including alternate, interchangeable, and/or equivalent structures, functions, ranges, or steps to those claimed, whether or not such alternate, interchangeable, and/or equivalent structures, functions, ranges, or steps are disclosed herein, and without intending to publicly dedicate any patentable subject matter.

The invention claimed is:

1. An optical mirror, comprising:
   a base layer;
   a binder layer, overlying and energetically bonded to the base layer, comprising aluminum metal;
   a reflective layer, overlying the binder layer, comprising aluminum metal;
   a protective layer, overlying the reflective layer, comprising silicon dioxide; and
   a top layer, overlying the protective layer, wherein the top layer is at least one of oleophobic and hydrophobic,
   wherein a combined thickness of the binder layer, the reflective layer, the protective layer, and the top layer varies by no more than about 2% across an area of the optical mirror.

2. The optical mirror of claim 1, wherein at least one of the binder layer and the protective layer is deposited via ion-aided deposition.

3. The optical mirror of claim 2, wherein the ion-aided deposition is argon ion-aided deposition.

4. The optical mirror of claim 1, wherein at least two of the following are true:
   (i) a thickness of the binder layer is between about 50 angstroms and about 450 angstroms;
   (ii) a thickness of the reflective layer is between about 500 angstroms and about 900 angstroms;
   (iii) a thickness of the protective layer is between about 950 angstroms and about 2350 angstroms; and
   (iv) a thickness of the top layer is between about 100 angstroms and about 300 angstroms.

5. The optical mirror of claim 1, wherein the protective layer is a first protective layer and the optical mirror further comprises a second protective layer positioned between the first protective layer and the top layer.

6. The optical mirror of claim 5, wherein the first protective layer has a first thickness of between about 950 angstroms and about 2350 angstroms, and wherein the second protective layer has a second thickness of between about 1 angstrom and about 600 angstroms.

7. The optical mirror of claim 5, wherein the first protective layer is deposited via ion-aided deposition, and the second protective layer is applied by a non- ion-aided vacuum deposition process.

8. The optical mirror of claim 1, wherein the binder layer is deposited at a rate of between about 0.1 angstroms per second and about 5.0 angstroms per second and the reflective layer is deposited at a rate of between about 15 angstroms per second and about 50 angstroms per second.

9. The optical mirror of claim 1, wherein an average reflectivity of the optical mirror, over a wavelength range between about 450 nanometers and about 650 nanometers, is at least about 85%.

10. The optical mirror of claim 1, wherein a radius of curvature of a front portion of the optical mirror is at least about 9 feet.

11. The optical mirror of claim 1, wherein a thickness of the binder layer is between about 50 angstroms and about 450 angstroms.

12. The optical mirror of claim 1, wherein a thickness of the reflective layer is between about 500 angstroms and about 900 angstroms.

13. The optical mirror of claim 1, wherein a thickness of the protective layer is between about 950 angstroms and about 2350 angstroms.

14. The optical mirror of claim 1, wherein a thickness of the top layer is between about 100 angstroms and about 300 angstroms.

15. The optical mirror of claim 14, wherein the thickness of the top layer is about 150 angstroms.

16. A coating for an optical mirror, comprising:
   a binder layer, comprising aluminum metal, deposited on an underlying substrate at a first rate;
   a reflective layer, overlying the binder layer, comprising aluminum metal, deposited at a second rate;
   a protective layer, overlying the reflective layer, comprising silicon dioxide; and
   a top layer, overlying the protective layer, wherein the top layer is at least one of oleophobic and hydrophobic,
   wherein a combined thickness of the binder layer, the reflective layer, the protective layer, and the top layer varies by no more than about 2% across an area of the optical mirror.

17. The coating of claim 16, wherein at least one of the binder layer and the protective layer is deposited via argon ion-aided deposition.

18. The coating of claim 16, wherein at least one of the following is true:
   (i) a thickness of the binder layer is between about 50 angstroms and about 450 angstroms;
   (ii) a thickness of the reflective layer is between about 500 angstroms and about 900 angstroms; and
   (iii) a thickness of the protective layer is between about 950 angstroms and about 2350 angstroms.

19. The coating of claim 16, wherein the protective layer is a lower protective layer and the coating further comprises an upper protective layer positioned between the lower protective layer and the top layer.

20. The coating of claim 16, wherein the first rate at which the binder layer is deposited is between about 0.1 angstroms per second and about 5.0 angstroms per second and the second rate at which the reflective layer is deposited is between about 15 angstroms per second and about 50 angstroms per second.

* * * * *